US012635138B2

(12) United States Patent
Kwon et al.

(10) Patent No.: US 12,635,138 B2
(45) Date of Patent: May 19, 2026

(54) SEMICONDUCTOR DEVICES AND DATA STORAGE SYSTEMS HAVING A PLURALITY OF INTERCONNECTED PERIPHERAL VIAS

(71) Applicant: Samsung Electronics Co., Ltd., Suwon-si (KR)

(72) Inventors: Donghoon Kwon, Hwaseong-si (KR); Chungki Min, Hwaseong-si (KR); Kihoon Jang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 775 days.

(21) Appl. No.: 17/828,339

(22) Filed: May 31, 2022

(65) Prior Publication Data

US 2023/0097021 A1     Mar. 30, 2023

(30) Foreign Application Priority Data

Sep. 29, 2021     (KR) ........................ 10-2021-0129125

(51) Int. Cl.
H10B 43/40          (2023.01)
H10B 43/10          (2023.01)
(Continued)

(52) U.S. Cl.
CPC ............. *H10B 43/40* (2023.02); *H10B 43/10* (2023.02); *H10B 43/27* (2023.02); *H10B 43/30* (2023.02); *H10B 43/50* (2023.02); *H01L 21/76805* (2013.01); *H01L 21/76816* (2013.01); *H01L 21/76831* (2013.01); *H01L 23/481* (2013.01);
(Continued)

(58) Field of Classification Search
CPC ........ H10B 43/10; H10B 43/27; H10B 43/30; H10B 43/40; H10B 43/50
See application file for complete search history.

(56) References Cited

U.S. PATENT DOCUMENTS 6,058,257 A * 5/2000 Nojima ................ H10D 84/907
                                                            716/120
9,666,281 B2 5/2017 Sakakibara
                  (Continued)

FOREIGN PATENT DOCUMENTS

KR        20050028575 A      3/2005

*Primary Examiner* — Yara B Green
*Assistant Examiner* — Christopher M Roland
(74) *Attorney, Agent, or Firm* — Wolf, Greenfield & Sacks, P.C.

(57)                    ABSTRACT

A semiconductor device includes: a first substrate; a second substrate including first and second regions; a stack structure in the first region and extending from the first region into the second region, the stack structure including interlayer insulating layers and gate layers, wherein the gate layers include gate pads having a step shape in the second region; a capping insulating layer at least partially covering the stack structure; an upper insulating layer on the stack structure and the capping insulating layer; a peripheral contact structure including a plurality of through-vias contacting the second substrate and spaced apart from the gate layers, and a peripheral contact pattern on the plurality of through-vias and connecting at least a portion of the plurality of through-vias to each other; a memory vertical structure; a support vertical structure; and a gate contact plug on the gate pads to be electrically connected to the gate pads.

20 Claims, 29 Drawing Sheets

(51) Int. Cl.

| | | |
|---|---|---|
| *H10B 43/27* | (2023.01) | |
| *H10B 43/30* | (2023.01) | |
| *H10B 43/50* | (2023.01) | |
| *H01L 21/768* | (2006.01) | |
| *H01L 23/48* | (2006.01) | |
| *H01L 23/522* | (2006.01) | |
| *H10D 84/01* | (2025.01) | |

(52) U.S. Cl.
CPC ...... *H01L 23/5226* (2013.01); *H10D 84/0149* (2025.01)

(56) References Cited

U.S. PATENT DOCUMENTS

| | | | |
|---|---|---|---|
| 9,812,461 B2 | 11/2017 | Doda et al. | |
| 9,847,341 B2 | 12/2017 | Shin et al. | |
| 11,024,642 B2 | 6/2021 | Lee et al. | |
| 2007/0155091 A1* | 7/2007 | Park | H10D 1/716 257/E21.648 |
| 2008/0073635 A1* | 3/2008 | Kiyotoshi | H10D 64/685 257/E21.409 |
| 2013/0299890 A1* | 11/2013 | Oh | H10D 84/212 257/306 |
| 2017/0133398 A1* | 5/2017 | Son | H10B 43/27 |
| 2018/0151587 A1* | 5/2018 | Son | H10B 63/30 |
| 2019/0006381 A1* | 1/2019 | Nakatsuji | H10B 43/10 |
| 2019/0333923 A1* | 10/2019 | Kim | H10B 43/27 |
| 2020/0194453 A1* | 6/2020 | Lim | H10B 43/10 |
| 2020/0212061 A1* | 7/2020 | Choi | H10B 43/27 |
| 2020/0411541 A1 | 12/2020 | Oh et al. | |
| 2021/0035910 A1 | 2/2021 | Kim et al. | |
| 2021/0082941 A1 | 3/2021 | Son et al. | |
| 2021/0305271 A1* | 9/2021 | Kim | H10B 43/27 |

* cited by examiner

SEMICONDUCTOR DEVICES AND DATA STORAGE SYSTEMS HAVING A PLURALITY OF INTERCONNECTED PERIPHERAL VIAS

CROSS-REFERENCE TO RELATED APPLICATION(S)

This application claims benefit of priority to Korean Patent Application No. 10-2021-0129125 filed on Sep. 29, 2021, in the Korean Intellectual Property Office, the disclosure of which is incorporated herein by reference in its entirety.

BACKGROUND

The present disclosure relates to semiconductor devices and data storage systems including the same.

In an electronic system requiring data storage, a semiconductor device capable of storing high-capacity data may be required. Accordingly, methods for increasing data storage capacity of semiconductor devices are being studied. For example, as a method for increasing data storage capacity of a semiconductor device, a semiconductor device including memory cells arranged three-dimensionally, instead of memory cells arranged two-dimensionally, has been proposed.

SUMMARY

An aspect of the present disclosure is to provide a semiconductor device having an improved degree of integration and reliability.

An aspect of the present disclosure is to provide a data storage system including a semiconductor device.

According to an aspect of the present disclosure, a semiconductor device comprises: a first substrate; a second substrate comprising a first region and a second region; a stack structure in the first region and extending from the first region into the second region, wherein the stack structure comprises one or more interlayer insulating layers and one or more gate layers, alternately stacked on the second substrate in a first direction perpendicular to an upper surface of the second substrate, wherein the one or more gate layers each comprise a plurality of gate pads arranged to have a step shape in the second region; a capping insulating layer that at least partially covers the stack structure; an upper insulating layer on the stack structure and the capping insulating layer; a peripheral contact structure comprising: a plurality of through-vias contacting the second substrate, spaced apart from the one or more gate layers, and extending in the first direction; and a peripheral contact pattern on the plurality of through-vias and connecting at least a portion of the plurality of through-vias to each other; a memory vertical structure contacting the second substrate and passing through the stack structure in the first region; a support vertical structure contacting the second substrate and passing through the stack structure in the second region; a gate contact plug on one or more of the plurality of gate pads and configured to be electrically connected to one or more of the plurality of gate pads; a peripheral upper plug on the peripheral contact pattern and contacting the peripheral contact pattern; and a peripheral wiring on the peripheral upper plug and electrically connected to the peripheral upper plug.

According to an aspect of the present disclosure, a semiconductor device comprises: a first substrate; circuit elements on the first substrate; a circuit wiring pattern electrically connected to the circuit elements; a second substrate above the circuit wiring pattern; a stack structure comprising one or more interlayer insulating layers and one or more gate layers, alternately stacked on the second substrate in a first direction perpendicular to an upper surface of the second substrate; and a first peripheral contact structure spaced apart from the stack structure, wherein the first peripheral contact structure comprises: a plurality of first through-vias extending in the first direction; and a first peripheral contact pattern on the plurality of first through-vias connecting at least a portion of the plurality of first through-vias to each other, wherein the circuit wiring pattern is below the plurality of first through-vias and connects the plurality of first through-vias, and wherein the first peripheral contact pattern has a shape corresponding to a shape of the circuit wiring pattern.

According to an aspect of the present disclosure, a data storage system comprises: a main substrate; a semiconductor device on the main substrate; and a controller electrically connected to the semiconductor device and controlling the semiconductor device, wherein the semiconductor device comprises: a first substrate; circuit elements on the first substrate; a circuit wiring pattern electrically connected to the circuit elements; a second substrate above the circuit wiring pattern; a stack structure comprising one or more interlayer insulating layers and one or more gate layers, alternately stacked on the second substrate in a first direction perpendicular to an upper surface of the second substrate; and a peripheral contact structure spaced apart from the one or more gate layers, wherein the peripheral contact structure comprises: a plurality of through-vias extending in the first direction; and a peripheral contact pattern on the plurality of through-vias connecting at least a portion of the plurality of through-vias to each other, wherein the circuit wiring pattern is below the plurality of through-vias and connects the plurality of through-vias, and the peripheral contact pattern has a shape corresponding to a shape of the circuit wiring pattern.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
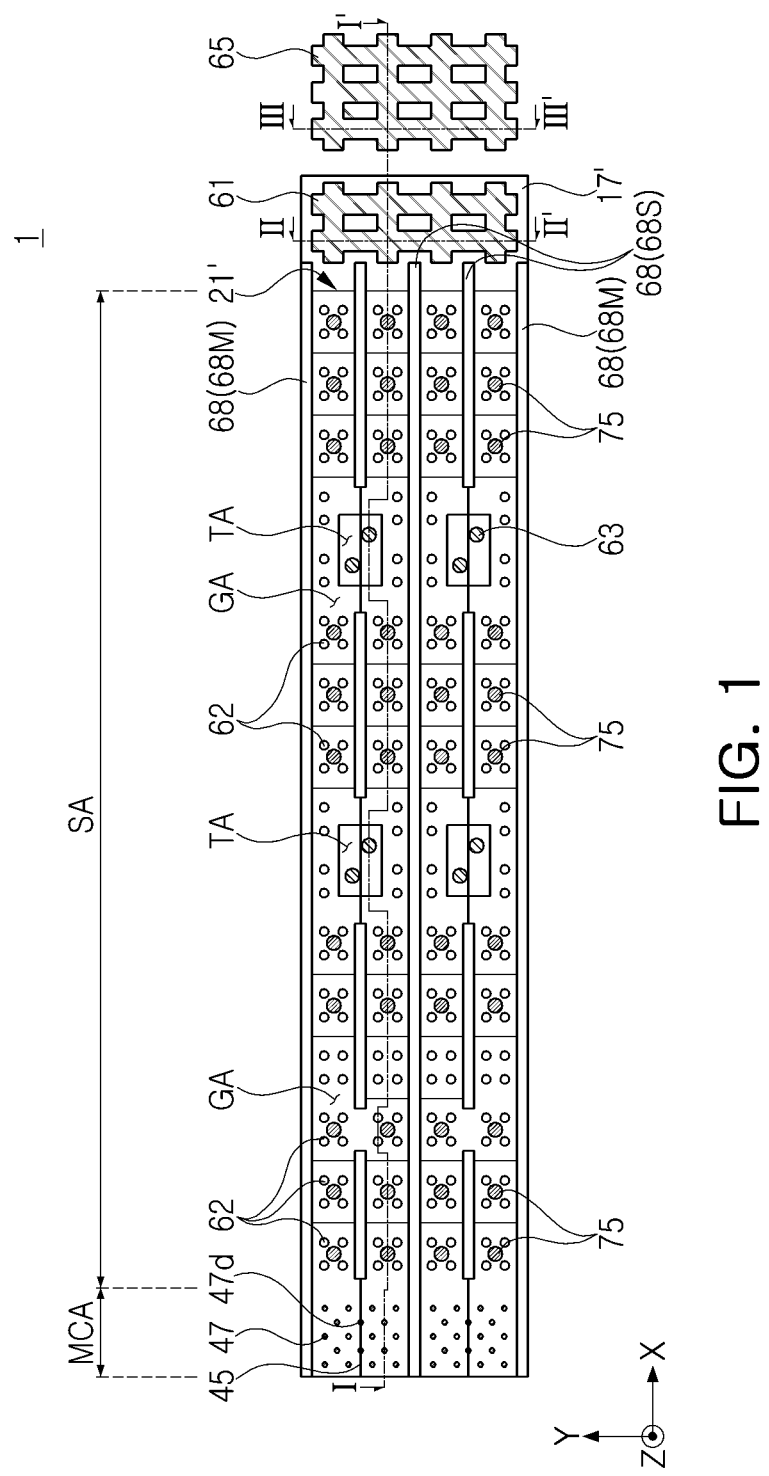
FIG. 1 is a top plan view illustrating a semiconductor device according to example embodiments.

Hereinafter, example embodiments of the present disclosure will be described with reference to the accompanying drawings.

Hereinafter, it can be understood that terms such as 'on,' 'upper,' 'upper portion,' 'upper surface,' 'below,' 'lower,' 'lower portion,' 'lower surface,' 'side surface,' and the like may refer to the drawings, except that they are specifically denoted by reference numerals and otherwise indicated. Terms such as "upper," "upper portion," "intermediate," "lower," "lower portion," and the like may be replaced with other terms, for example, "first," "second," "third," and the like, to be used to describe elements of the specification. Terms such as "first" and "second" may be used to describe various elements, but the elements are not limited by the terms, and "a first element" may be referred to as "a second element."

First, an example embodiment of a semiconductor device according to an embodiment of the present disclosure will be described with reference to FIGS. 1 to 2C. FIG. 1 is a top plan view illustrating a semiconductor device according to example embodiments, and FIGS. 2A to 2C are cross-sectional views schematically illustrating illustrative examples of a semiconductor device according to an embodiment of the present disclosure. FIGS. 2A to 2C illustrate cross-sectional views of the semiconductor device of FIG. 1, taken along lines I-I', II-II', and III-III', respectively.

Figure 2A:
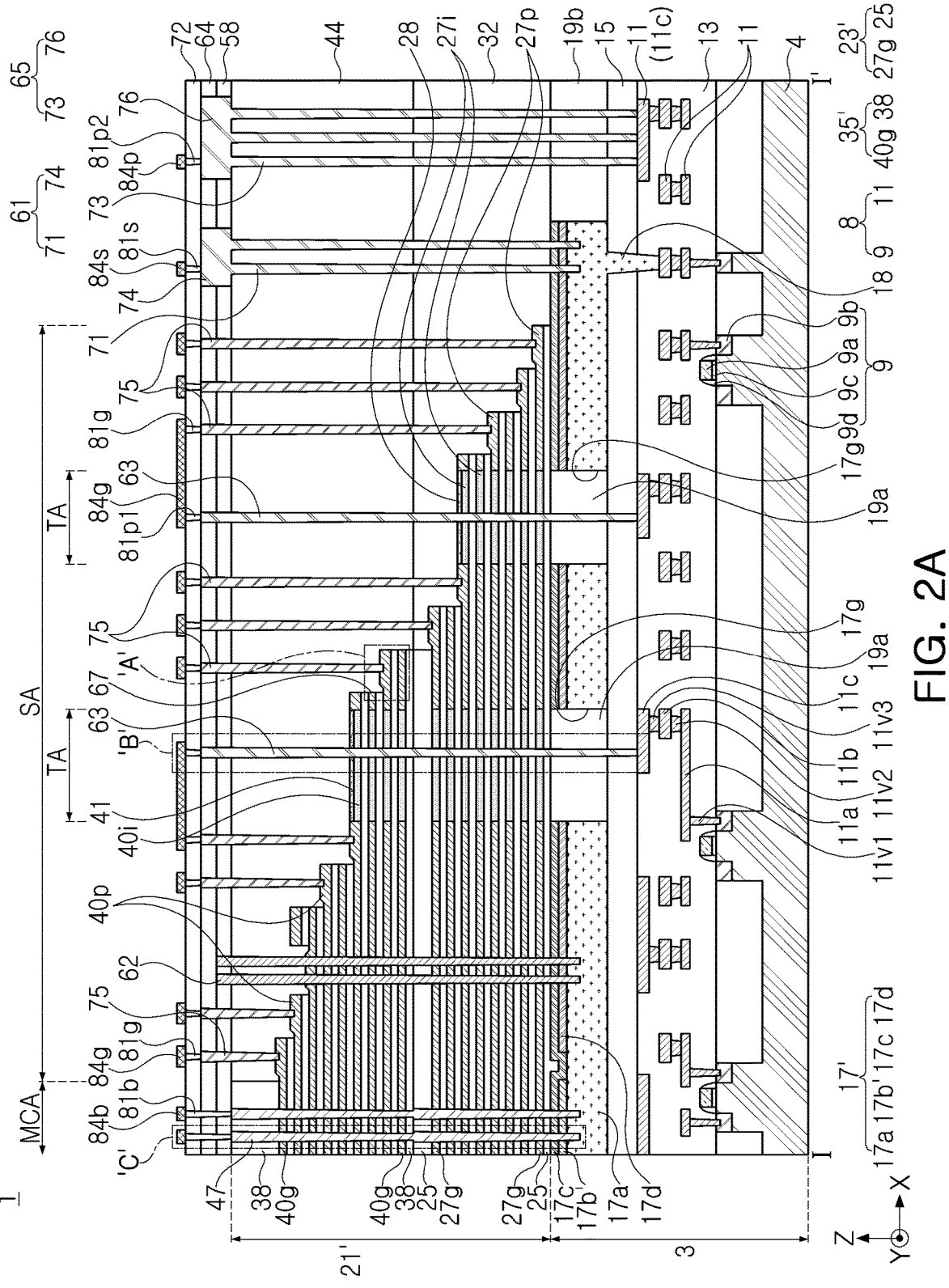
FIGS. 2A to 2C are cross-sectional views schematically illustrating illustrative examples of a semiconductor device according to an example embodiment of the present disclosure.
Figure 2B:
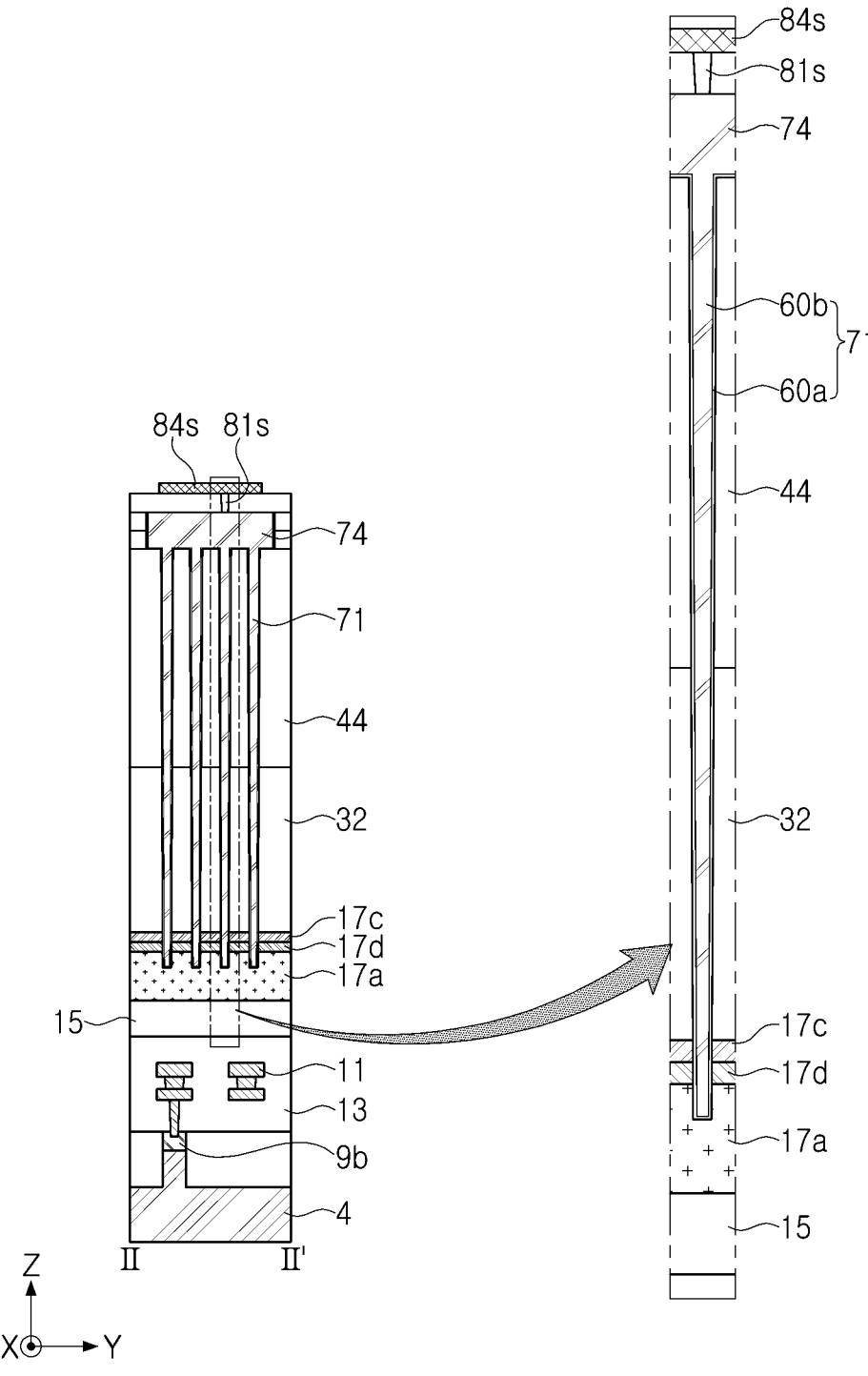
Figure 2C:
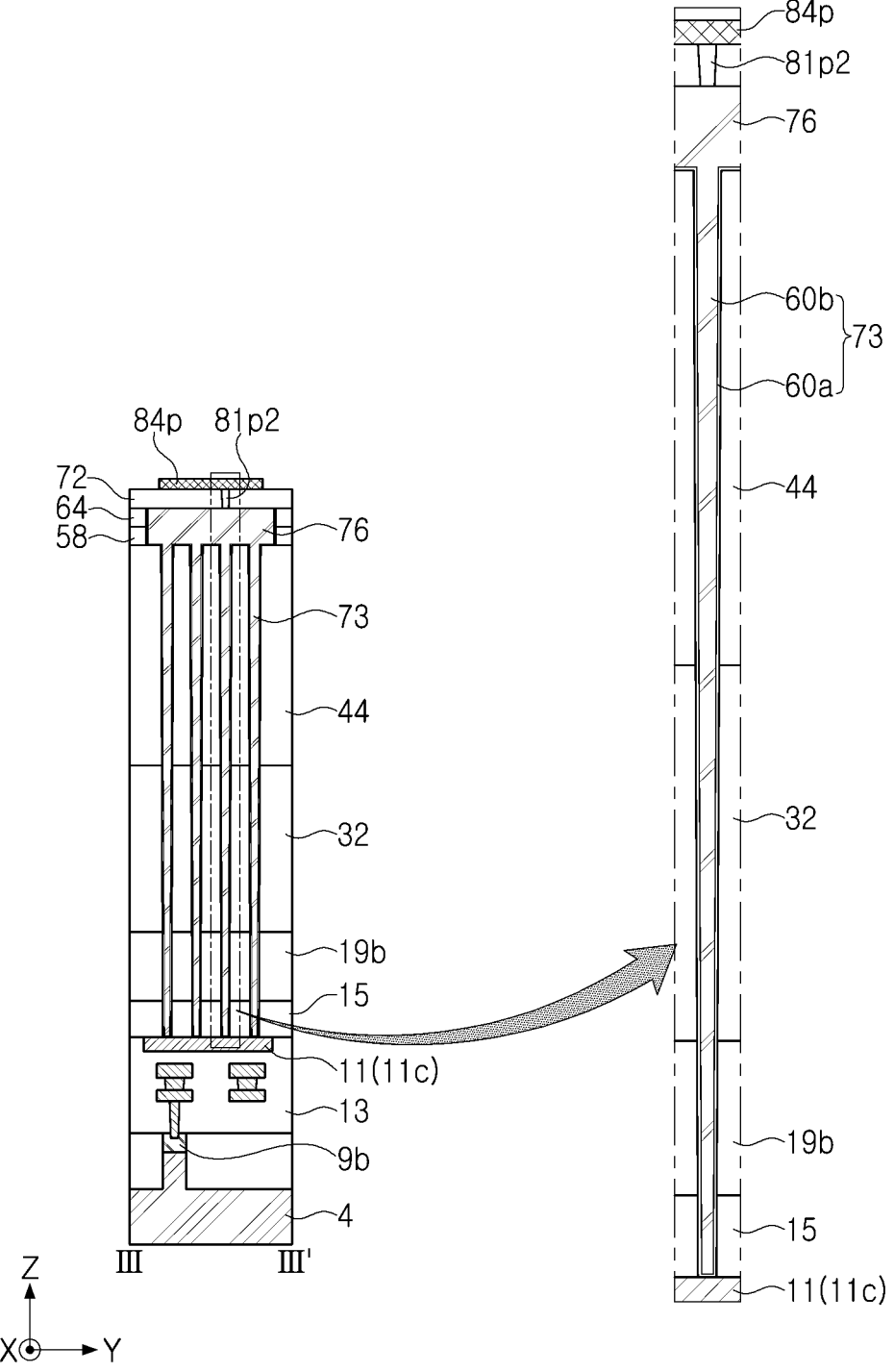

Referring to FIGS. 1 to 2C, a semiconductor device 1 according to an example embodiment may include a first structure 3 and a second structure 21' overlapping the first structure 3 in a vertical direction Z. As used herein, when element A is said to "overlap" or is "overlapping" element B, it may refer to the situation where element A is said to extend over or past, and cover a part of, element B in a given direction. Note that element A may overlap element B in a first direction, but may or may not overlap element B in a second direction. Components of the semiconductor device 1 according to an example embodiment are not limited to the above-described example embodiment, and other components may be added or any one component may be omitted according to example embodiments.

In an illustrative example, the first structure 3 may include a first substrate 4, a peripheral circuit 8 on the first substrate 4, a first lower insulating layer 13 on the first substrate 4 and at least partially covering the peripheral circuit 8, and a second lower insulating layer 15 on the first lower insulating layer 13. The peripheral circuit 8 may include a circuit element 9 such as a transistor including a peripheral gate electrode 9a and a peripheral source/drain region 9b, a peripheral gate dielectric layer 9c, and a spacer layer 9d, and a circuit wiring pattern 11 electrically connected to the circuit element 9. The circuit wiring pattern 11 may include a first wiring line 11a, a second wiring line 11b, and a third wiring line 11c. In addition, the circuit wiring pattern 11 may include a first lower contact plug 11v1 connecting the peripheral source/drain region 9b and the first wiring line 11a, a second lower contact plug 11v2 connecting the first and second wiring lines 11a and 11b, and a third lower contact plug 11v3 connecting the second and third wiring lines 11b and 11c. In an illustrative example, the second lower insulating layer 15 may be on the first lower insulating layer 13, and a pattern structure 17' may be above the first lower insulating layer 13.

In an illustrative example, the first structure 3 may include a pattern structure 17'. The pattern structure 17' may include at least one silicon layer.

In an illustrative example, the pattern structure 17' may include a second substrate 17a, a first pattern layer 17b', a second pattern layer 17c, and a third pattern layer 17d. The first pattern layer 17b' and the third pattern layer 17d may be arranged on the second substrate 17a to be spaced apart from each other. The second pattern layer 17c may at least partially cover the first pattern layer 17b' and the third pattern layer 17d on the second substrate 17a. The second substrate 17a may have a thickness greater than a thickness of each of the first pattern layer 17b', the second pattern layer 17c, and the third pattern layer 17d. At least one of the second substrate 17a, the first pattern layer 17b', the second pattern layer 17c, and the third pattern layer 17d may include a silicon layer. For example, the second substrate 17a, the first pattern layer 17b', and the second pattern layer 17c may include a silicon layer, for example, a silicon layer having an N-type conductivity, and the third pattern layer 17d may include a material different from a material of the silicon layer. For example, the third pattern layer 17d may include a plurality of layers sequentially stacked, for example, a silicon oxide layer, a silicon nitride layer, and a silicon oxide layer.

In an illustrative example, the pattern structure 17' may further include a ground pattern 18. For example, the ground pattern 18 may be below the second substrate 17a, and may be grounded to the first substrate 4 through a portion of the circuit wiring pattern 11. As used herein, when the term Element A is "below" Element B is used, it may refer to the situation where Element A is closer to a reference plane in a particular direction than Element B. For example, in FIG. 2A, the ground pattern 18 is said to be below the second substrate 17a because it is closer in the vertical, or Z, direction to a top surface of the first substrate 4 than the second substrate 17a. Likewise, when the term Element A is "above" Element B is used, it may refer to the situation where Element A is further away from a reference plane in a particular direction than Element B. For example, in FIG. 2A, the second substrate 17a is said to be above the circuit element 9 because the second substrate 17a is further away from the top surface of the first substrate 4 in the vertical, or Z, direction than the circuit element 9 is. The ground pattern 18 may extend from the second substrate 17a. For example, when the second substrate 17a is formed of a silicon layer, the ground pattern 18 may be formed of a silicon layer extending from the silicon layer.

In an illustrative example, the pattern structure 17' may have gaps 17g. In this case, each of the gaps 17g may be a slit or an opening passing through the pattern structure 17'.

In an illustrative example, the first structure 3 may further include an inner intermediate insulating layer 19a filling the gaps 17g, and an outer intermediate insulating layer 19b on an outside of the pattern structure 17'.

In an example embodiment, the second structure 21' may include a memory cell array region MCA and a stepped region SA. The second structure 21' may include stack structures 23' and 35', arranged in the memory cell array region MCA, and extending from the memory cell array region MCA into the stepped region SA.

In an illustrative example, the stack structures 23' and 35' may include a first stack structure 23' and a second stack structure 35' on the first stack structure 23'. The first stack structure 23' may include first interlayer insulating layers 25 and first gate layers 27g, alternately and repeatedly stacked in the vertical direction Z. The vertical direction Z may be a direction perpendicular to an upper surface of the pattern structure 17'. The first gate layers 27g may have a first plurality of gate pads 27p arranged to have a step shape in the stepped region SA.

In an illustrative example, the second stack structure 35' may include second interlayer insulating layers 38 and second gate layers 40g that may be alternately and repeatedly stacked in the vertical direction Z. The second gate layers 40g may have a second plurality of gate pads 40p arranged to have a step shape in the stepped region SA.

The first interlayer insulating layers 25 and the second interlayer insulating layers 38 may constitute the interlayer insulating layers 25 and 38, and the first gate layers 27g and the second gate layers 40g may constitute the gate layers 27g and 40g. Therefore, the stack structures 23' and 35' may include the interlayer insulating layers 25 and 38 and gate layers 27g and 40g, alternately and repeatedly stacked in the vertical direction Z, respectively. The gate layers 27g and 40g may have first and second gate pads 27p and 40p, arranged to have a step shape in the stepped region SA.

In some embodiments, the 'gate pad' may be defined as a region of a gate layer that may not be at least partially covered by another gate layer in the stepped region SA.

In some embodiments, the first and second gate pads 27p and 40p may be arranged to have various step shapes as well as the step shape illustrated in the drawing.

In an illustrative example, each of the first and second gate pads 27p and 40p has a thickness greater than a thickness of each of the first and second gate layers 27g and 40g located in the memory cell array region MCA.

In an illustrative example, each of the first and second gate layers 27g and 40g may include a conductive material. For example, each of the first and second gate layers 27g and 40g may be formed of any one material or two or more materials of doped polysilicon, metal-semiconductor compounds (e.g., TiSi, TaSi, CoSi, NiSi, WSi, or the like), metal nitrides (e.g., TiN, TaN, WN, or the like), or metals (e.g., titanium (Ti), tungsten (W), or the like). The interlayer insulating layers 25 and 38 may be formed of an insulating material such as silicon oxide or the like.

In an illustrative example, the stack structures 23' and 35' may further include one or more through-regions TA. Each of the through-regions TA may further include insulating horizontal layers 27i and 40i, located on the same level as first and second gate layers 27g and 40g adjacent to the through-regions TA, among the first and second gate layers 27g and 40g. For example, among the through-regions TA, a portion of the through-region TA adjacent to the first gate layers 27g may include first insulating horizontal layers 27i on the same level as the first gate layers 27g, and a portion of the through-region TA adjacent to the second gate layers 40g may include second insulating horizontal layers 40i on the same level as the second gate layers 40g.

In an illustrative example, each of the through-regions TA may further include reinforcing horizontal layers 28 and 41 on an uppermost insulating horizontal layer and contacting the uppermost insulating horizontal layer among the insulating horizontal layers 27i and 40i. For example, the through-region TA spaced apart from the second stack structure 35' may include a first reinforcing horizontal layer 28 contacting an uppermost first insulating horizontal layer among the first insulating horizontal layers 27i, and the through-region TA located in the first and second stack structures 23' and 35' may include a second reinforcing horizontal layer 41 contacting an uppermost second insulating horizontal layer among the second insulating horizontal layers 40i.

In an illustrative example, the first and second insulating horizontal layers 27i and 40i may be formed of an insulating material different from an insulating material of the first and second interlayer insulating layers 25 and 38, respectively. For example, the first and second insulating horizontal layers 27i and 40i may be formed of first silicon nitride, and the first and second interlayer insulating layers 25 and 38 may be formed of silicon oxide.

In an illustrative example, the first and second reinforcing horizontal layers 28 and 41 may be formed of a second silicon nitride having an etch rate different from an etch rate of the first silicon nitride of the first and second insulating horizontal layers 27i and 40i. The second silicon nitride may be a material having an etch rate faster than that of the first silicon nitride.

When viewed in the same plane as in FIG. 1, in the stack structures 23' and 35', each of the through-regions TA may be surrounded by a gate region GA of FIG. 1. In this case, the gate region GA may be a region in which the first and second gate layers 27g and 40g are disposed. Therefore, each of the through-regions TA may be surrounded by adjacent respective first and second gate layers 27g and 40g.

In an illustrative example, the second structure 21' may further include capping insulating layers 32 and 44. The capping insulating layers 32 and 44 may include a first capping insulating layer 32 and a second capping insulating layer 44. The first capping insulating layer 32 may at least partially cover the first gate pads 27p, a portion of the pattern structure 17' not at least partially covered by the first stack structure 23', and the outer intermediate insulating layer 19b. The second capping insulating layer 44 may at least partially cover the second gate pads 40p and the first capping insulating layer 32. The first and second capping insulating layers 32 and 44 may be formed of an insulating material such as silicon oxide or the like.

The semiconductor device 1 according to an embodiment may further include a memory vertical structure 47 passing through the second structure 21'. The memory vertical structure 47 may include a portion passing through the stack structures 23' and 35' in the memory cell array region MCA. The memory vertical structure 47 may extend from a portion passing through the second structure 21' into the pattern structure 17' to contact the pattern structure 17'. For example, the memory vertical structure 47 may sequentially pass through the second pattern layer 17c and the first pattern layer 17b' and may extend into the second substrate 17a. The memory vertical structure 47 may be in contact with at least one of the second substrate 17a, the first pattern layer 17b', and the second pattern layer 17c that may be formed of a silicon layer. Therefore, the memory vertical structure 47 may be in contact with at least one silicon layer of the pattern structure 17'.

A semiconductor device 1 according to an embodiment may further include a string separation pattern 45 passing through one or more upper gate layers located in an upper portion thereof, among the second gate layers 40g. The string separation pattern 45 may be formed of silicon oxide.

The semiconductor device 1 according to an embodiment may further include a dummy vertical structure 47d passing through the second structure 21' while passing through the string separation pattern 45, and contacting the pattern structure 17'. The dummy vertical structure 47d may have the same cross-sectional structure as the memory vertical structure 47, and may be formed of the same material as the memory vertical structure 47.

A semiconductor device 1 according to an embodiment may include a first upper insulating layer 58 on the second structure 21', a second upper insulating layer 64 on the first upper insulating layer 58, and a third upper insulating layer 72 on the second upper insulating layer 64. The first to third upper insulating layers 58, 64, and 72 may include silicon oxide, respectively.

A semiconductor device 1 according to an embodiment may further include one or more support vertical structures 62 passing through the first upper insulating layer 58 and the second structure 21' and contacting the pattern structure 17'. At least a plurality of the support vertical structures 62 may sequentially pass through the second pattern layer 17c and the third pattern layer 17d of the pattern structure 17', and may extend into the second substrate 17a. Any one of the support vertical structures 62 may be spaced apart from the third pattern layer 17d, may pass through the second pattern layer 17c, and may extend into the second substrate 17a.

A plurality of support vertical structures 62 may be disposed, but for convenience of description, a single support vertical structure will be mainly described.

An upper surface of the support vertical structure 62 may be disposed on a higher level than an upper surface of the memory vertical structure 47.

In some embodiments, "level" may mean a height level when viewed with respect to an upper surface of the pattern structure 17'. When an Element A is said to be at a "higher level" than Element B, this may mean that Element A is a height level that is further away from an upper surface of the pattern structure 17' than the height level of Element B. When an Element A is said to be at a "lower level" than Element B, this may mean that Element A is a height level that is closer to an upper surface of the pattern structure 17' than the height level of Element B.

In an illustrative example, the support vertical structure 62 may include silicon oxide.

A semiconductor device 1 according to an embodiment may further include peripheral contact structures 61, 63, and 65. The peripheral contact structures 61, 63, and 65 may include a first peripheral contact structure 61, a second peripheral contact structure 63, and a third peripheral contact structure 65.

In an illustrative example, the first peripheral contact structure 61 may include a plurality of first through-vias 71, and a first peripheral contact pattern 74 at least partially covering upper surfaces of the plurality of first through-vias 71 and connecting the plurality of first through-vias 71 to each other. The plurality of first through-vias 71 may pass through the second structure 21', and may be in contact with the pattern structure 17'. The first through-vias 71 may pass through the first and second capping insulating layers 32 and 44 of the second structure 21', and may be spaced apart from the stack structures 23' and 35' of the second structure 21'. The first peripheral contact pattern 74 may be formed to pass through the first and second upper insulating layers 58 and 64. The plurality of first through-vias 71 and the first peripheral contact pattern 74 may be integrally formed. For example, the plurality of first through-vias 71 and the first peripheral contact pattern 74 may be formed by a single deposition process, and may include the same material. No interface may be provided between the plurality of first through-vias 71 and the first peripheral contact pattern 74 in some embodiments.

In an illustrative example, in the pattern structure 17', the second substrate 17a formed of a polysilicon layer having an N-type conductivity may be a common source layer, and the first peripheral contact structure 61 may be a common source contact plug electrically connected to the common source layer.

In an illustrative example, the second peripheral contact structure 63 may pass through the first upper insulating layer 58, the second structure 21', and the inner intermediate insulating layer 19a, and may extend in a downward direction to contact the circuit wiring pattern 11. The second peripheral contact structure 63 may pass through at least one of the first and second capping insulating layers 32 and 44 of the second structure 21', and may pass through the through-region TA in the stack structures 23' and 35' of the second structure 21'. Therefore, the second peripheral contact structure 63 may include a portion passing through the insulating horizontal layers 27i and 40i of the through-region TA.

In an illustrative example, the third peripheral contact structure 65 may include a plurality of third through-vias 73, and a third peripheral contact pattern 76 at least partially covering upper surfaces of the plurality of third through-vias 73 and connecting the plurality of third through-vias 73 to each other. The plurality of third through-vias 73 may pass through the first and second capping insulating layers 32 and 44 of the second structure 21', the outer intermediate insulating layer 19b, and the second lower insulating layer 15, and may extend in a downward direction to contact the circuit wiring pattern 11.

The first to third peripheral contact structures 61, 63, and 65 may be spaced apart from the first and second gate layers 27g and 40g of the stack structures 23' and 35'.

The first and third through-vias 71 and 73 may extend to substantially the same level as the upper surface of the memory vertical structure 47. Upper surfaces of the first and third peripheral contact patterns 74 and 76 may be on a level higher than the upper surface of the support vertical structure 62, but the present disclosure is not limited thereto. Upper surfaces of the first and third peripheral contact patterns 74 and 76 may be disposed on the same level as the upper surface of the support vertical structure 62 or may be on a lower level than the upper surface of the support vertical structure 62.

A semiconductor device 1 according to an embodiment may further include separation structures 68 passing through the second upper insulating layer 64, the first upper insulating layer 58, and the second structure 21'. Each of the separation structures 68 may be formed of silicon oxide. The separation structures 68 may include a plurality of main separation structures 68M parallel to each other, and auxiliary separation structures 68S disposed between the main separation structures 68M. Each of the separation structures 68 may include a linear portion extending in a first horizontal direction X. The first horizontal direction X may be parallel to the upper surface of the pattern structure 17'. The first horizontal direction X may be a direction from the memory cell array region MCA to the stepped region SA. Each of the auxiliary separation structures 68S may have a length, shorter than a length of each of the main separation structures 68M. The main separation structures 68M may pass through the second structure 21', and may separate the stack structures 23' and 35' in a second horizontal direction Y. The second horizontal direction Y may be parallel to the upper surface of the pattern structure 17', and may be perpendicular to the first horizontal direction X.

Each of the separation structures 68 may be in contact with gate layers 27g and 40g adjacent to the separation structures 68.

In an illustrative example, the separation structures 68 may extend from a portion passing through the second structure 21' in a downward direction, to contact the pattern structure 17'. At least one of the separation structures 68 may be in contact with the second substrate 17a.

A semiconductor device 1 according to an embodiment may further include a dielectric layer 67 (see FIGS. 3 and 5 as discussed below). The dielectric layer 67 may include a high-k dielectric having a dielectric constant, higher than a dielectric constant of silicon oxide. For example, the dielectric layer 67 may be formed of a high-k dielectric such as aluminum oxide, lanthanum oxide, hafnium oxide, or the like.

The dielectric layer 67 may include a first dielectric layer portion and a second dielectric layer portion. The first dielectric layer portion may at least partially cover upper and lower surfaces of each of the gate layers 27g and 40g, may be between each of the gate layers 27g and 40g and the memory vertical structure 47, and may be between each of the gate layers 27g and 40g and the support vertical structure 62. The second dielectric layer portion may extend from the first dielectric layer portion, and may at least partially cover a side surface of the separation structure 68 not contacting the gate layers 27g and 40g.

A semiconductor device 1 according to an embodiment may further include gate contact plugs 75 passing through the first and second upper insulating layers 58 and 64 and extending in a downward direction to contact the second gate pads 40p.

A semiconductor device 1 according to an embodiment may further include a bit line contact plug 81b passing through the first to third upper insulating layers 58, 64, and 72 and electrically connected to the memory vertical structure 47.

In an illustrative example, the bit line contact plug 81b may include a side surface, not vertically aligned with a side surface of the memory vertical structure 47.

A semiconductor device 1 according to an embodiment may further include peripheral upper plugs 81s, 81p1, and 81p2 passing through the third upper insulating layers 72. The peripheral upper plugs 81s, 81p1, and 81p2 may further include a first peripheral upper plug 81s electrically connected to the first peripheral contact structure 61, a second peripheral upper plug 81p1 electrically connected to the second peripheral contact structure 63, and a third peripheral upper plug 81p2 electrically connected to the third peripheral contact structure 65.

A semiconductor device 1 according to an embodiment may further include gate upper plugs 81g passing through the third upper insulating layer 72 and electrically connected to the gate contact plugs 75.

In an illustrative example, the gate contact plugs 75 and the gate upper plugs 81g may include a first gate contact plug and a first gate upper plug contacting each other, and the first gate contact plug may include a side surface, not vertically aligned with a side surface of the first gate upper plug.

A semiconductor device 1 according to an example embodiment may further include wirings 84b, 84g, 84s, and 84p on the third upper insulating layer 72. The wirings 84b, 84g, 84s, and 84p may include bit lines 84b electrically connected to the bit line contact plugs 81b, gate connection wires 84g electrically connecting each of the gate upper plugs 81g and each of the plurality of second peripheral upper plugs 81p1, a first peripheral wiring 84s electrically connected to the first peripheral upper plug 81s, and a second peripheral wiring 84p electrically connected to the third peripheral upper plug 81p2.

Figure 3:
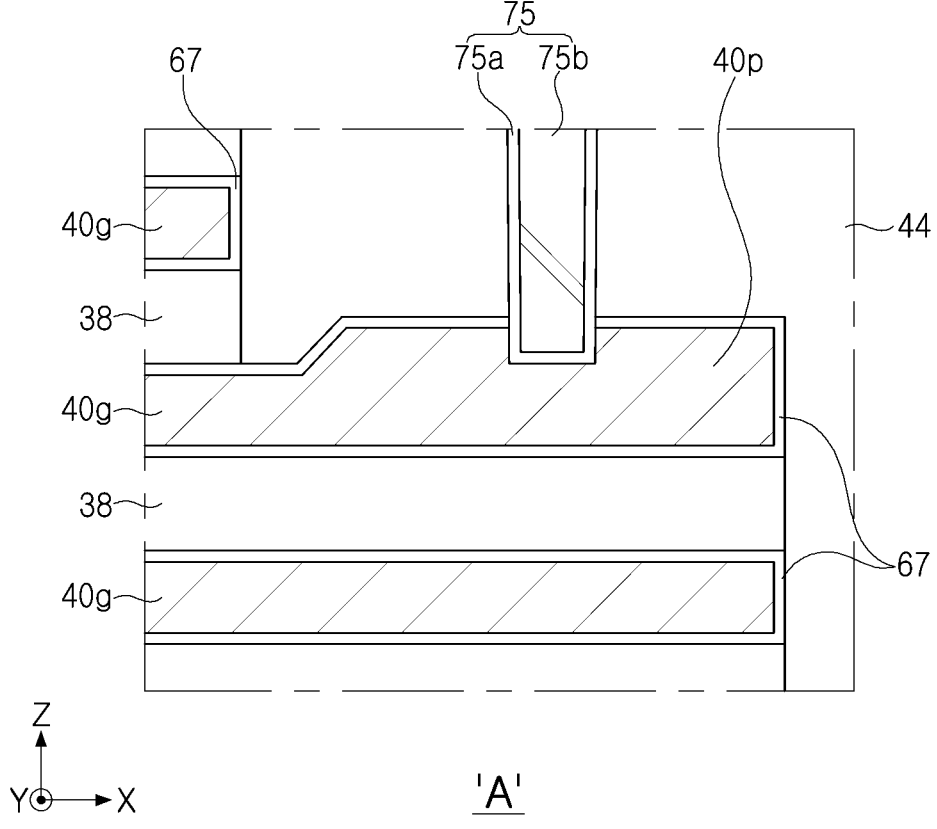
FIGS. 3 to 5 are partially enlarged cross-sectional views illustrating a semiconductor device according to example embodiments.
Figure 4:
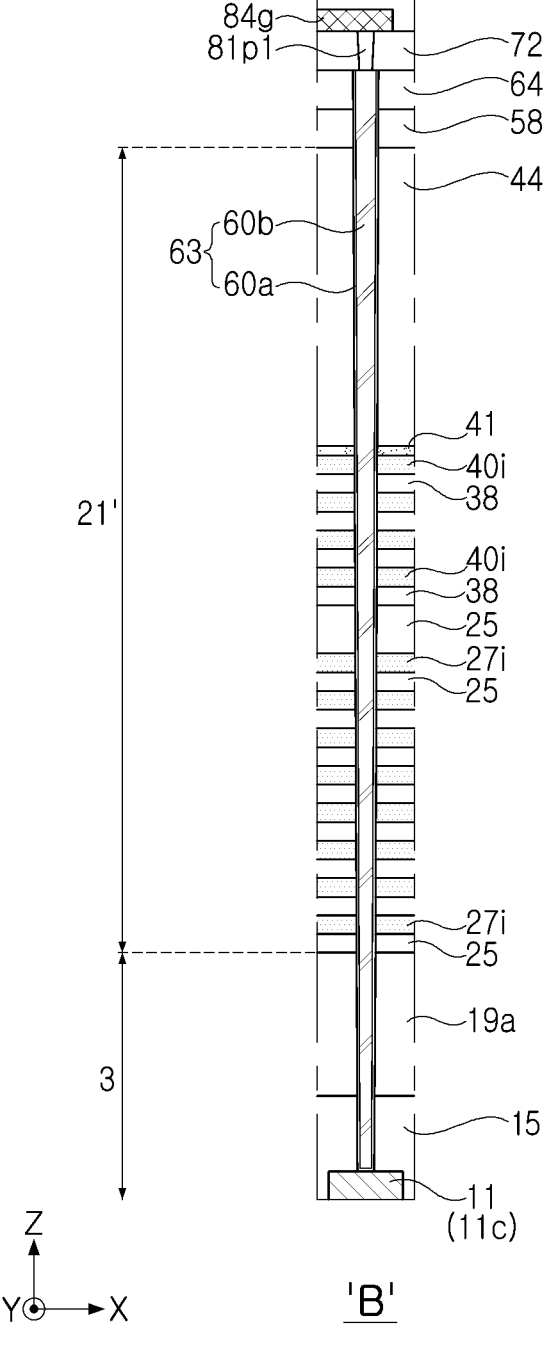
Figure 5:
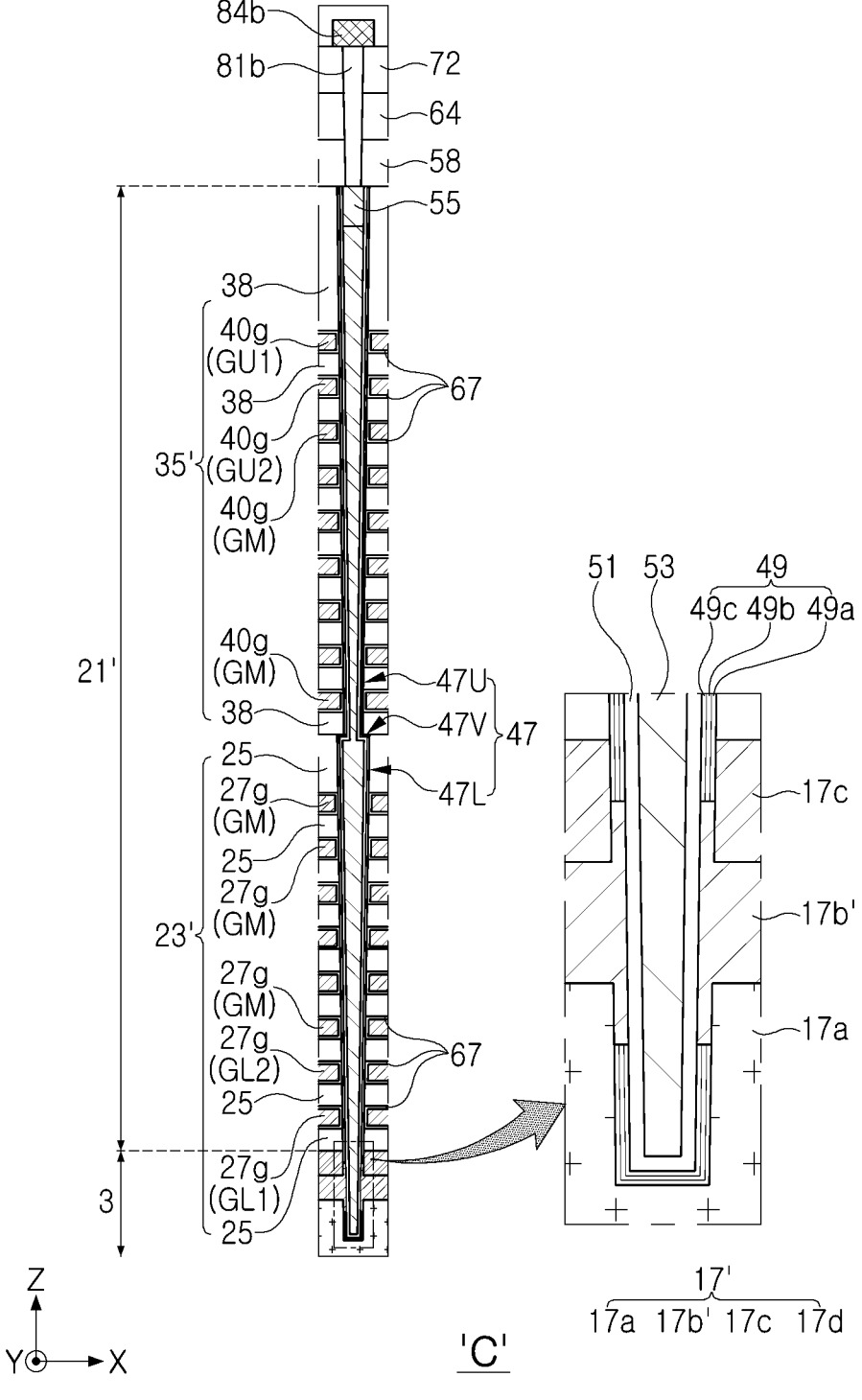

Next, FIGS. 3 to 5 are partially enlarged cross-sectional views illustrating a semiconductor device according to example embodiments. FIGS. 3 to 5 are partially enlarged views of region 'A', region 'B', and region 'C' of FIG. 2A, respectively.

An illustrative example of the gate contact plugs 75 will be described with reference to FIG. 3. Each of the gate contact plugs 75 may include a plug pattern 75b and a liner layer 75a at least partially covering side and bottom surfaces of the plug pattern 75b. The liner layer 75a may include at least one of a metal material such as titanium (Ti) or the like, or a metal nitride such as TiN or the like. The plug pattern 75b may include a metal material such as tungsten (W) or the like.

Next, an illustrative example of the second peripheral contact structures 63 will be described with reference to FIG. 4. Referring to FIG. 4, each of the second peripheral contact structures 63 may include a plug pattern 60b and a liner layer 60a at least partially covering side and bottom surfaces of the plug pattern 60b. The liner layer 60a may include at least one of a metal material such as titanium (Ti) or the like, or a metal nitride such as TiN or the like. The plug pattern 60b may include a metal material such as tungsten (W) or the like. The first peripheral contact structure 61 may include the same material as the second and third peripheral contact structures 63 and 65, for example, the liner layer 60a and the plug pattern 60b.

Next, an illustrative example of the gate layers 27g and 40g and the memory vertical structure 47 will be described with reference to FIG. 5.

Referring to FIG. 5, the gate layers 27g and 40g may include one or more lower gate layers (e.g., GL1 and GL2), one or more upper gate layers (e.g., GU1 and GU2), and a plurality of intermediate gate layers GM between the one or more lower gate layers (e.g., GL1 and GL2) and the one or more upper gate layers (e.g., GU1 and GU2). In an illustrative example, the one or more upper gate layers (e.g., GU1 and GU2) may be provided as a plurality of upper gate layers that may be spaced apart from each other in the vertical direction Z. For example, the plurality of upper gate layers (e.g., GU1 and GU2) may include a first upper gate layer GU1 and a second upper gate layer GU2 below the first upper gate layer GU1.

In an illustrative example, the one or more lower gate layers (e.g., GL1 and GL2) may be provided as a plurality of lower gate layers that may be spaced apart from each other in the vertical direction Z. For example, the plurality of lower gate layers (e.g., GL1 and GL2) may include a first lower gate layer GL1 and a second lower gate layer GL2 on the first lower gate layer GL1.

In an illustrative example, the plurality of intermediate gate layers GM may be word lines.

In an illustrative example, the first lower gate layer GL1 may be a ground select gate line of a ground select transistor, and the second lower gate layer GL2 may be a dummy gate line. In another example, the first lower gate layer GL1 may be an erase control gate line of an erase control transistor that may be used in an erase operation of erasing data stored in memory cells using a gate induced drain leakage (GIDL) phenomenon, and the second lower gate layer GL2 may be a ground select gate line of a ground select transistor.

In an illustrative example, the plurality of upper gate layers (e.g., GU1 and GU2) may be string select gate lines of string select transistors. In another example, among the plurality of upper gate layers (e.g., GU1 and GU2), a first upper gate layer GU1 may be an erase control gate line of an erase control transistor, and a second upper gate layer GU2 may be a string select gate line of a string select transistor.

The memory vertical structure 47 may include a lower vertical portion 47L passing through the first stack structure 23', and an upper vertical portion 47U passing through the second stack structure 35'.

In an illustrative example, a width of an upper region of the lower vertical portion 47L may be different from a width of a lower region of the upper vertical portion 47U. For example, the width of the upper region of the lower vertical portion 47L may be wider than the width of the lower region of the upper vertical portion 47U.

In an illustrative example, a side surface of the lower vertical portion 47L and a side surface of the upper vertical portion 47U, adjacent to each other, may not be aligned in the vertical direction Z.

In an illustrative example, an intermediate side surface of the memory vertical structure 47 located on a height level between an uppermost first gate layer among the first gate layers 27g of the first stack structure 23' and a lowermost second gate layer among the second gate layers 40g of the second stack structure 35' may include a curved portion 47V.

On the same height level as the curved portion 47V of the intermediate side surface of the memory vertical structure 47, a side surface of each of the separation structures 68 described above may be substantially straight line, and a side surface of each of the peripheral contact structures 61, 63, and 65 may be substantially straight line.

The memory vertical structure 47 may include an insulating gap-fill layer 53, a channel layer 51 at least partially covering outer side and bottom surfaces of the insulating gap-fill layer 53, an information storage structure 49 at least partially covering outer side and bottom surfaces of the channel layer 51, and a pad material layer 55 on the insulating gap-fill layer 53.

The information storage structure 49 may include a first dielectric layer 49c at least partially covering the outer side and bottom surfaces of the channel layer 51, an information storage material layer 49b at least partially covering outer side and bottom surfaces of the first dielectric layer 49c, and a second dielectric layer 49a at least partially covering outer side and bottom surfaces of the information storage material layer 49b. The first dielectric layer 49c may be in contact with the channel layer 51, and the information storage material layer 49b may be spaced apart from the channel layer 51. The insulating gap-fill layer 53 may include silicon oxide, for example, silicon oxide that may be formed by an atomic layer deposition process, or silicon oxide having voids formed therein. The second dielectric layer 49a may include silicon oxide or silicon oxide doped with impurities. The first dielectric layer 49c may include at least one of silicon oxide or a high-k dielectric. The information storage material layer 49b may include a material capable of trapping charges to store information, for example, silicon nitride.

The information storage material layer 49b of the information storage structure 49 of the memory vertical structure 47 may include regions capable of storing information in a semiconductor device such as a flash memory device. The channel layer 51 may include polysilicon. The pad material layer 55 may include at least one of doped polysilicon, a metal nitride (e.g., TiN or the like), a metal (e.g., tungsten (W) or the like), or a metal-semiconductor compound (e.g., TiSi or the like).

The memory vertical structure 47 may sequentially pass through the second pattern layer 17c and the first pattern layer 17b' of the pattern structure 17', and may extend into the second substrate 17a. In the pattern structure 17', the first pattern layer 17b' may pass through the information storage structure 49, and may be in contact with the channel layer 51.

In one embodiment, the support vertical structure 62 of FIG. 2A may not include a material of the channel layer 51 of the memory vertical structure 47. In one embodiment, the support vertical structure (62 in FIG. 2A) may be formed of an insulating material, for example, silicon oxide.

Next, an illustrative example of a first peripheral contact structure 61 will be described with reference to FIGS. 6A to 6C.

Figure 6A:
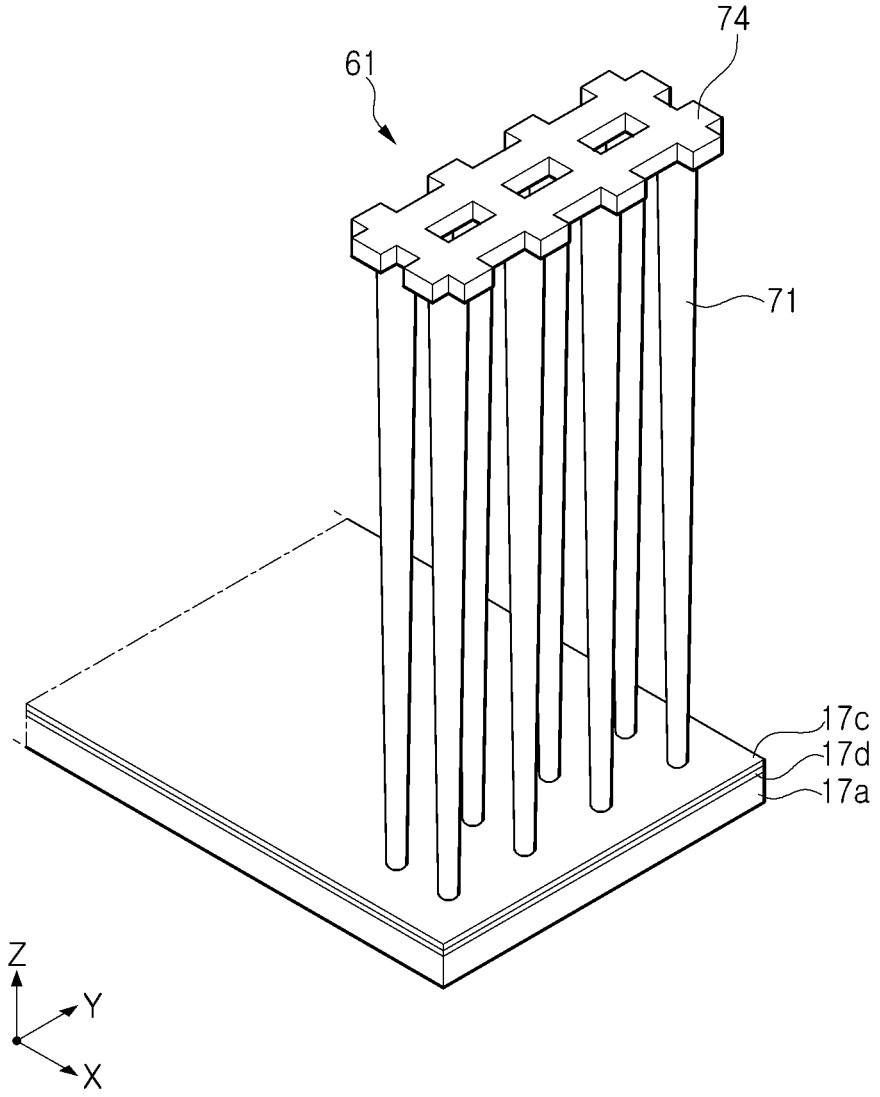
FIG. 6A is a partial perspective view schematically illustrating a semiconductor device according to example embodiments.
Figure 6B:
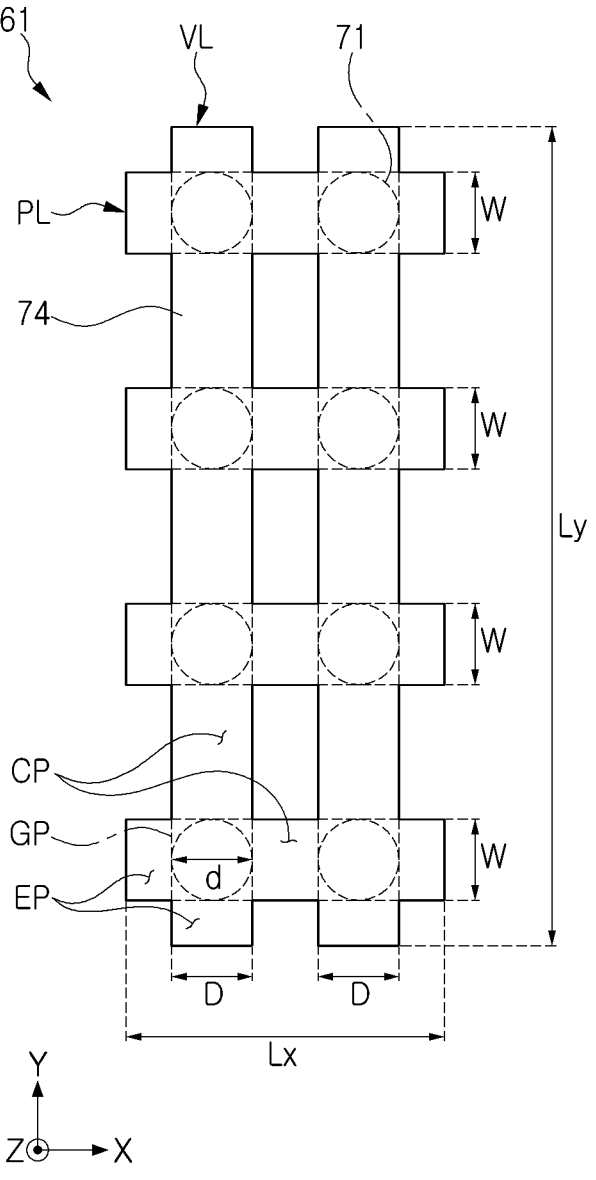
FIGS. 6B and 6C are plan views schematically illustrating a semiconductor device according to example embodiments.
Figure 6C:
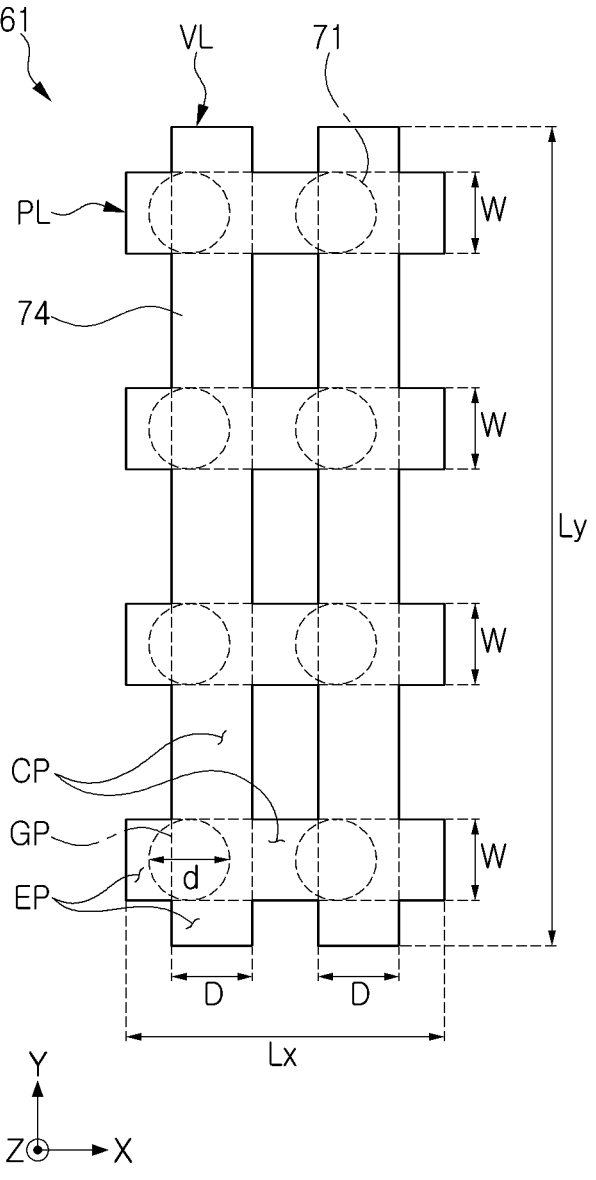

FIG. 6A is a partial perspective view schematically illustrating a semiconductor device according to example embodiments, and FIGS. 6B and 6C are plan views schematically illustrating a semiconductor device according to example embodiments.

Referring to FIG. 6A, a first peripheral contact structure 61 may include a plurality of first through-vias 71, and a first peripheral contact pattern 74 connecting the plurality of first through-vias 71 while at least partially covering upper surfaces of the plurality of first through-vias 71. The plurality of first through-vias 71 and the first peripheral contact pattern 74 may be integrally formed. The plurality of first through-vias 71 may pass through a second pattern layer 17c and a third pattern layer 17d to be connected to a second substrate 17a.

Referring to FIG. 6B, a first peripheral contact pattern 74 may include first lines PL extending in a second direction parallel to an upper surface of a second substrate 17a, for example, in the direction X, and second lines VL crossing the first lines PL and extending in a third direction, for example, in the direction Y. The first peripheral contact pattern 74 may have a shape in which the first lines PL and the second lines VL cross to have a grid shape. Although FIG. 6B illustrates a grid shape in which the second lines VL and the first lines PL cross at right angles, the present disclosure is not limited thereto, and angles between vertical lines and horizontal lines may be changed according to a space between through-vias, a size of each of the through-vias, and the like.

First through-vias 71 may have a first width d in the direction X corresponding to a respective diameter, each of the second lines VL may have a second width D in the direction X that is substantially equal to the first width d, and each of the first lines PL may have a width W in the direction Y that is substantially equal to the first width d. Also, each of the second lines VL may have a length Ly extending in the direction Y, and the length Ly may be longer than a maximum distance between the plurality of first through-vias 71 spaced apart in the direction Y. Each of the first lines PL may have a length Lx extending in the direction X, and the length Lx may be longer than a maximum distance between the plurality of first through-vias 71 spaced apart in the direction X. For example, the first peripheral contact pattern 74 may include an intersection portion GP in which each of the second lines VL and each of the first lines PL intersect, a connection portion CP connecting neighboring intersection portions GP, and a protrusion portion EP extending from the intersection portion GP in a direction opposite to the connection portion CP. Upper surfaces of the first through-vias 71 may be in the intersection portion GP.

As illustrated in FIG. 6C, upper surfaces of first through-vias 71 may be disposed to cross an intersection portion GP and a protrusion portion EP. Alternatively, the upper surfaces of the first through-vias 71 may be disposed to cross the intersection portion GP and a connection portion CP. According to the present embodiment, a bonding defect between the first through-vias 71 and a peripheral contact disposed on the first through-vias 71, for example, a first peripheral contact pattern 74, may be significantly improved. In a comparative example, when upper contacts having the same or similar shape as through-vias are individually formed on each of the through-vias, and the upper contacts are formed to be misaligned from intended positions thereof, this may cause problems such that poor bonding between the through-vias and the upper contacts occurs. According to the present embodiment, as illustrated in FIG. 6C, even when the upper surfaces of the first through-vias 71 are not in the intersection portion GP of the first peripheral contact pattern 74, since the first through-vias 71 may be bonded to the protrusion portion EP or the connection portion CP around the intersection portion GP of the first peripheral contact pattern 74, a non-bonding area in which the first peripheral contact pattern 74 and the first through-vias 71 are not bonded to each other may be minimized. Therefore, the problem of poor bonding between the first through-vias 71 and the first peripheral contact pattern 74 may be remarkably improved.

Figure 7:
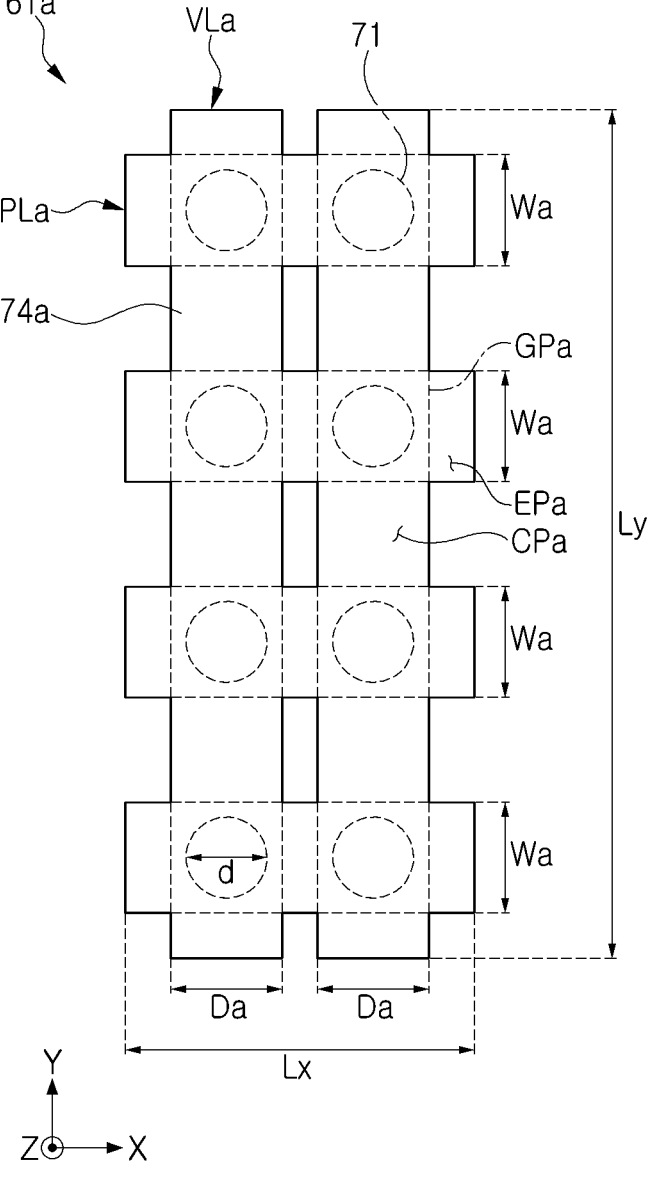
FIG. 7 is a plan view schematically illustrating a semiconductor device according to example embodiments.
Figure 8A:
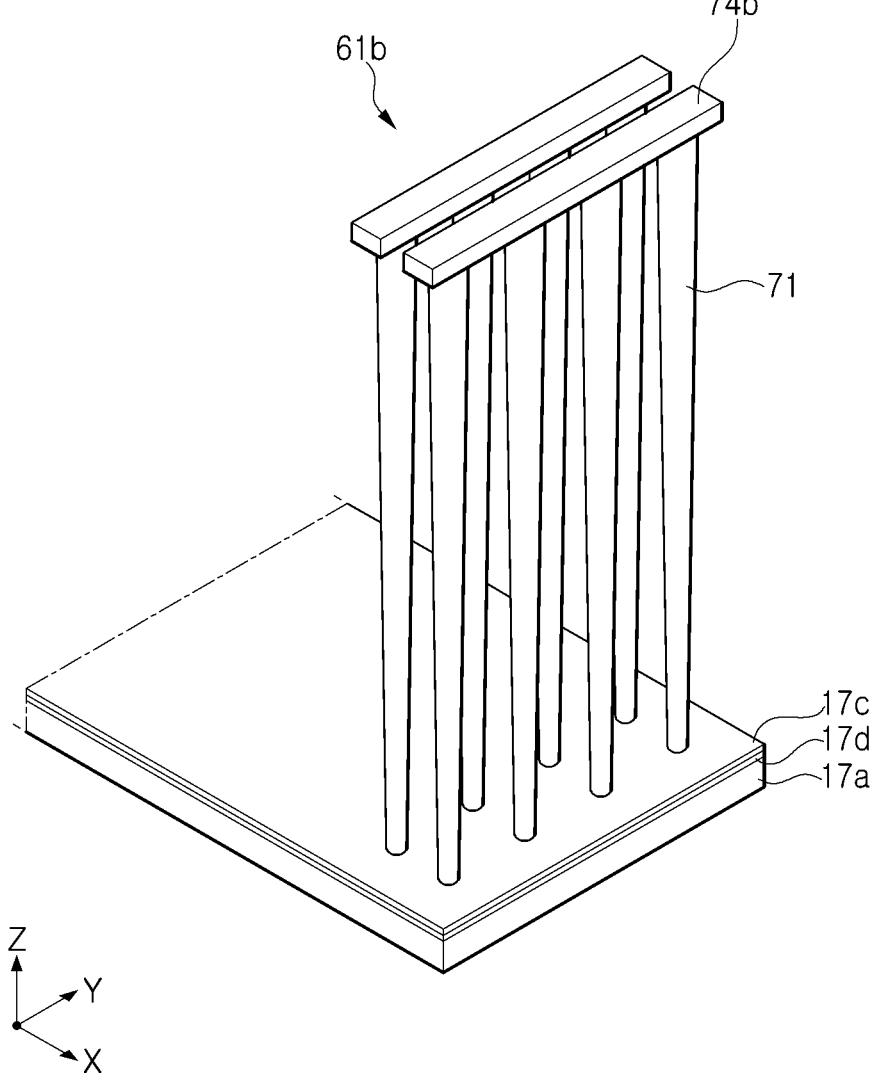
FIG. 8A is a partial perspective view schematically illustrating a semiconductor device according to example embodiments.
Figure 8B:
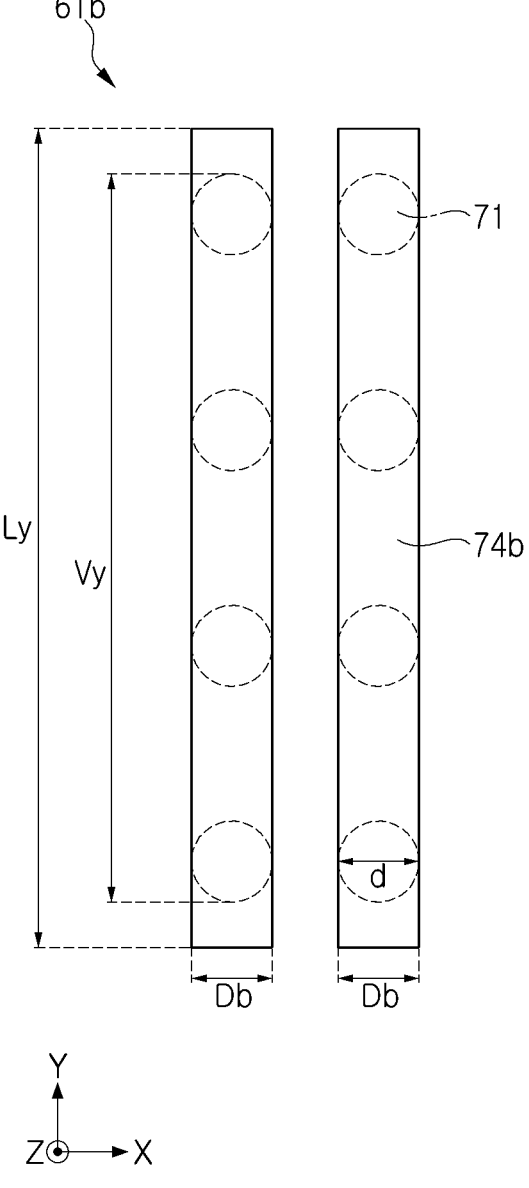
FIG. 8B is a plan view schematically illustrating a semiconductor device according to example embodiments.
Figure 9:
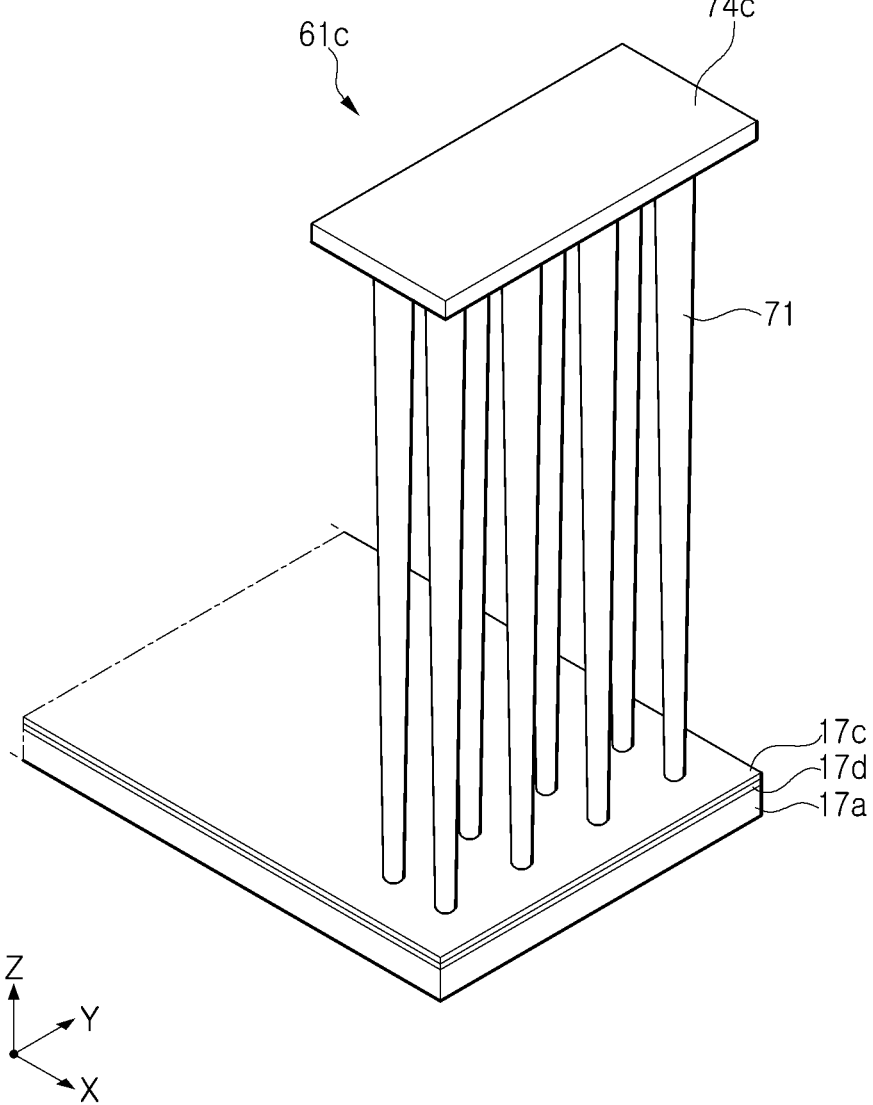
FIG. 9 is a partial perspective view schematically illustrating a semiconductor device according to example embodiments.

Next, FIGS. 7 to 9 illustrate modified examples of the semiconductor devices according to the example embodiments of FIGS. 6A to 6C. In embodiments of FIGS. 7 to 9, the same reference numerals as those of FIGS. 1 to 6C indicate corresponding configurations, and a description overlapping the above description will be omitted. When the embodiments of FIGS. 7 to 9 have the same reference numerals as those of FIGS. 1 to 6C, but have different alphabets, it may be for explaining the embodiments different from FIGS. 1 to 6C, and features described in the same reference numerals described above may be the same or similar.

Referring to FIG. 7, the present embodiment may be different from the embodiments illustrated in FIGS. 6A to 6C in that a first peripheral contact structure 61a includes a first peripheral contact pattern 74a including second lines VLa having a second width Da that is wider than a first width d, and first lines PLa having a third width Wa that is wider than the first width d. For example, an intersection portion GPa may have a length in the direction X and a length in the direction Y that are both greater than the first width d. Therefore, even when the first peripheral contact structure 61a is misaligned from an intended position thereof, a non-bonding area between the first peripheral contact structure 61a and respective first through-vias 71 may be minimized.

Next, referring to FIG. 8A, the present embodiment may be different from the embodiment of FIG. 6A in that a first peripheral contact structure 61b includes a first peripheral contact pattern 74b including lines extending in a direction parallel to a second substrate 17a, for example, in the direction Y, and arranged parallel to each other. As illustrated in FIG. 8B, the first peripheral contact pattern 74b may include lines having a length Ly extending in the direction Y, and the length Ly may be longer than a maximum distance Vy between first through-vias 71 spaced apart from each other in the direction Y. Therefore, even when the first peripheral contact structure 61b is misaligned from an intended position thereof in the direction Y, a non-bonding area between the first peripheral contact structure 61b and the first through-vias 71 may be minimized.

Although a width Db of the first peripheral contact pattern 74b is illustrated to be substantially the same as a diameter d of each of the first through-vias 71 in FIG. 8B, the width Db of the first peripheral contact pattern 74b may be greater than the diameter d of each of the first through-vias 71, as described above. FIGS. 8A and 8B illustrate an embodiment in which the first peripheral contact pattern 74b includes only lines extending in the direction Y, but the extending direction of the first peripheral contact pattern 74b is not limited thereto. For example, the first peripheral contact pattern 74b may include lines extending in the direction X, and may connect the first through-vias 71 to each other.

Next, referring to FIG. 9, the present embodiment may be different from the embodiment of FIG. 6A in that a first peripheral contact structure 61c has a first peripheral contact pattern 74c having a plate shape. The first peripheral contact pattern 74c may be on first through-vias 71 to entirely cover upper surfaces of the first through-vias 71. For example, in the embodiment in which the first through-vias 71 are connected to a second substrate 17a, a shape of the first peripheral contact pattern 74c connecting the first through-vias 71 may be a lattice shape, a linear shape, or a plate shape, but are not limited thereto, and may have a zigzag shape, a ladder shape, and the like.

Figure 10:
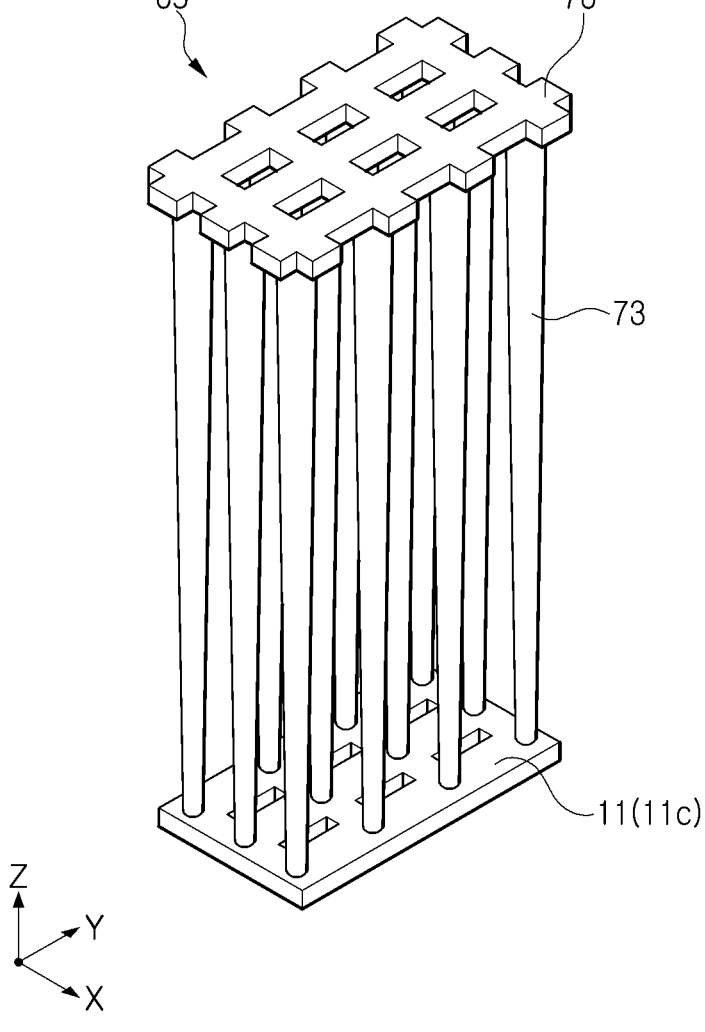
FIG. 10 is a partial perspective view schematically illustrating a semiconductor device according to example embodiments.

Next, an illustrative example of a third peripheral contact structure 65 will be described with reference to FIG. 10. FIG. 10 is a partial perspective view schematically illustrating a semiconductor device according to example embodiments.

As illustrated in FIG. 10, a third peripheral contact structure 65 may include third through-vias 73 on an outside of a second substrate 17a and connected to a third wiring line 11c of a circuit wiring pattern 11. The third wiring lines 11c below the third through-vias 73 and connected to the third through-vias 73 may have a grid shape. A third peripheral contact pattern 76 on the third through-vias 73 and connecting at least a portion of the third through-vias 73 to each other may have a shape corresponding to the third wiring lines 11c. The term "shape corresponding to ~" may mean to have the same shape or pattern while having the same size or a size expanded or reduced by a certain ratio. For example, the third peripheral contact pattern 76 may have a lattice shape corresponding to the third wiring line 11c.

Figure 11:
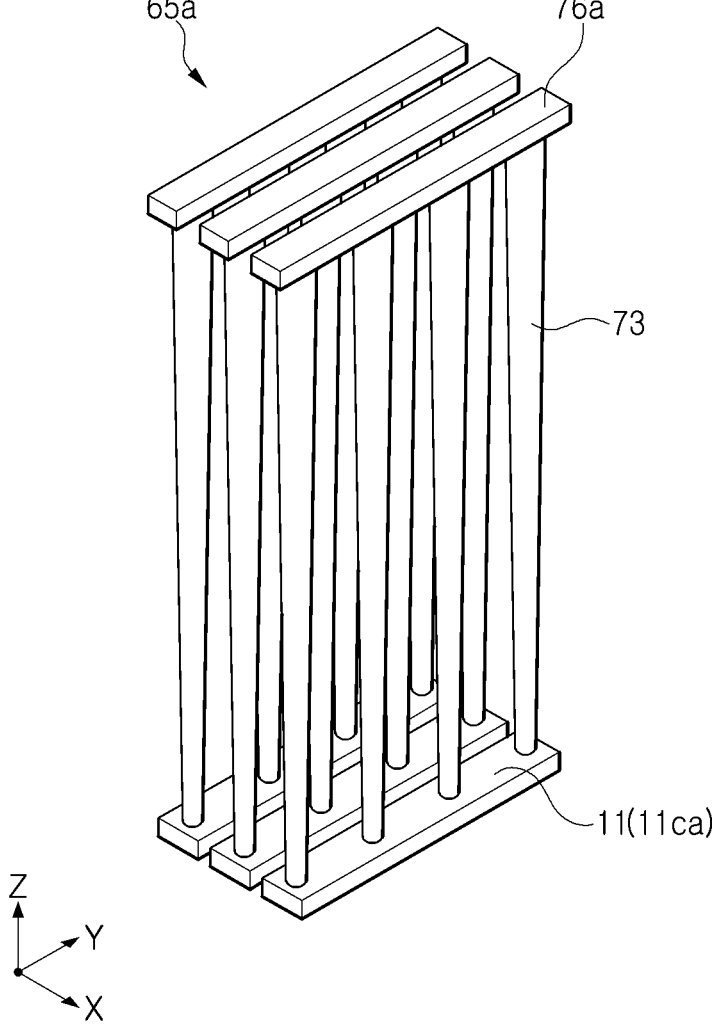
FIG. 11 is a partial perspective view schematically illustrating a semiconductor device according to example embodiments.
Figure 12:
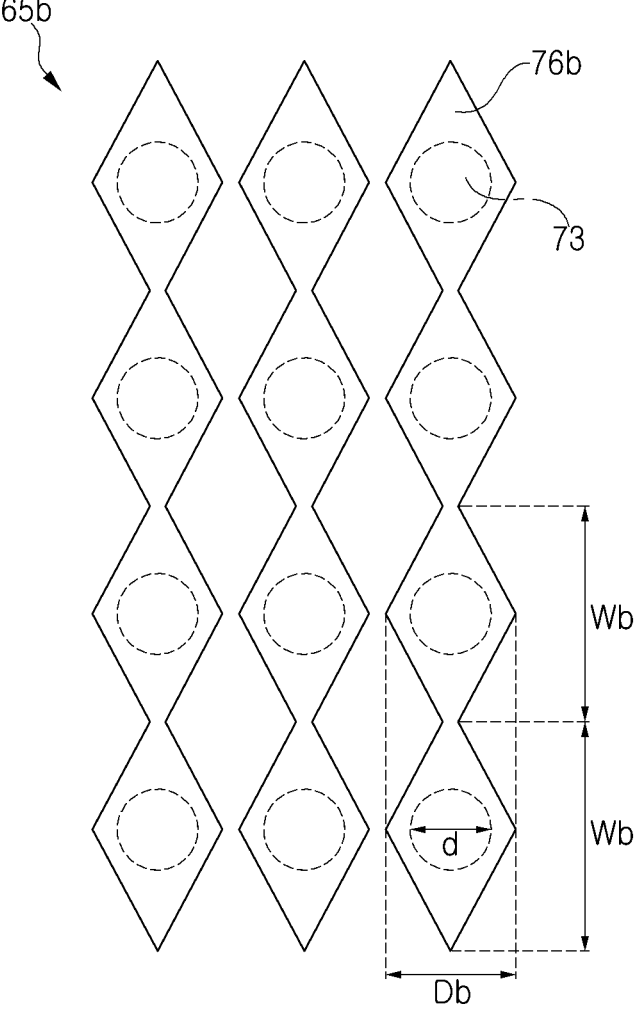
FIG. 12 is a plan view schematically illustrating a semiconductor device according to example embodiments.

Next, FIGS. 11 and 12 illustrate modified examples of the semiconductor device according to the example embodiment of FIG. 10. In the embodiment of FIGS. 11 to 12, the same reference numerals as those of FIGS. 1 to 10 indicate corresponding configurations, and a description overlapping the above description will be omitted. When the embodiments of FIGS. 11 and 12 have the same reference numerals as those of FIGS. 1 to 10, but have different alphabets, it may be for explaining the embodiments different from FIGS. 1 to 10, and features described in the same reference numerals described above may be the same or similar.

Referring to FIG. 11, the present embodiment may be different from the embodiments illustrated in FIG. 10 in that third wiring lines 11ca below a third through-vias 73 of a third peripheral contact structure 65a and connecting the third through-vias 73 have a linear shape. A third peripheral contact pattern 76a on the third through-vias 73 and connecting at least a portion of the third through-vias 73 to each other may have a linear shape corresponding to the third wiring lines 11ca.

Referring to FIG. 12, the present embodiment may be different from the embodiment of FIG. 11 in that a third peripheral contact structure 65b includes a third peripheral contact pattern 76b having a zigzag shape. For example, the third peripheral contact pattern 76b may have a shape having continuously and repeatedly a substantially rhombus pattern having a diagonal length Db in the direction X and a diagonal length Wb in the direction Y. The length Db and the length Wb may be greater than a diameter d of a third through-via 73, respectively.

Hereinafter, an illustrative method of forming a semiconductor device according to an embodiment of the present disclosure will be described with reference to FIGS. 13A to 13I.

Figure 13A:
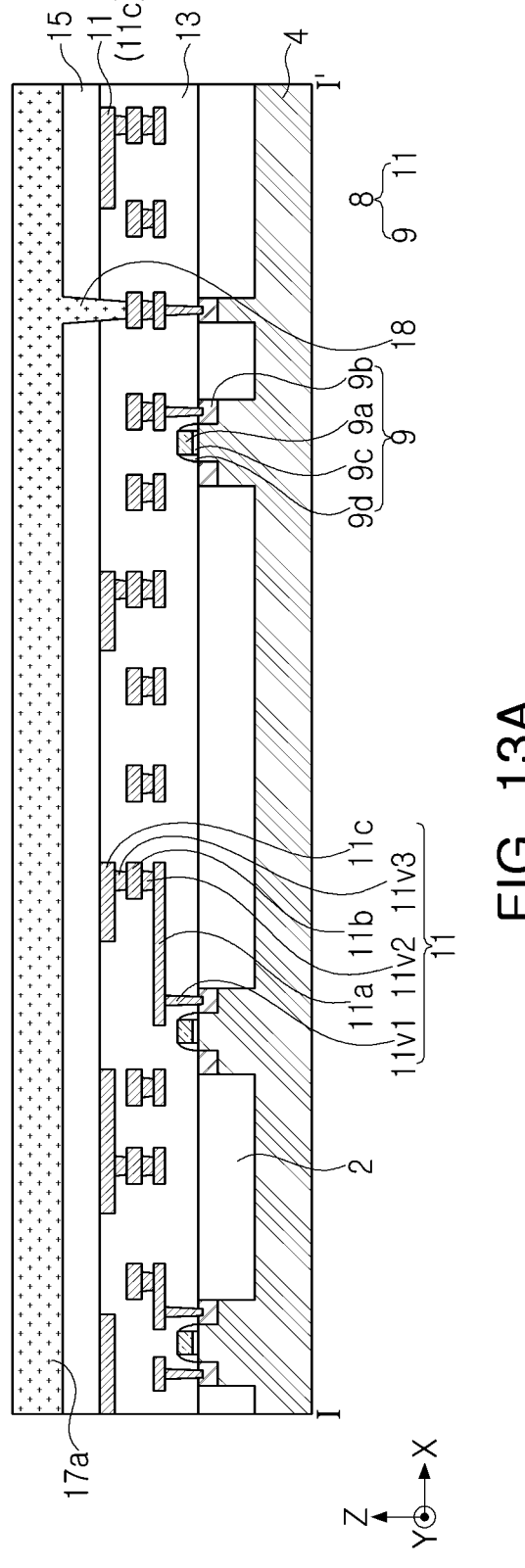
FIGS. 13A to 13I are cross-sectional views schematically illustrating a method of manufacturing a semiconductor device according to example embodiments.

Referring to FIG. 13A, a circuit element 9 and a lower circuit wiring pattern 11 may be formed on a first substrate 4.

First, device isolation layers 2 may be formed in the first substrate 4, and a peripheral gate dielectric layer 9c and a peripheral gate electrode 9a may be sequentially formed on the first substrate 4. The device isolation layers 2 may be formed by, for example, a shallow trench isolation (STI) process. The peripheral gate dielectric layer 9c and the peripheral gate electrode 9a may be formed using atomic layer deposition (ALD) or chemical vapor deposition (CVD). The peripheral gate dielectric layer 9c may be formed of silicon oxide, and the peripheral gate electrode 9a may be formed of at least one of polycrystalline silicon or a metal silicide layer, but the present disclosure is not limited thereto. Next, a spacer layer 9d and a peripheral source/drain region 9b may be formed on both sidewalls of the peripheral gate dielectric layer 9c and the peripheral gate electrode 9a. In some embodiments, the spacer layer 9d may be formed as a plurality of layers. Next, an ion implantation process may be performed to form the peripheral source/drain regions 9b.

First to third lower contact plugs 11v1, 11v2, and 11v3 of the circuit wiring pattern may be prepared by partially forming a first lower insulating layer 13, removing a portion thereof by etching, and then filling a conductive material therein. First to third wiring lines 11a, 11b, and 11c may be formed by, for example, depositing a conductive material thereon and then patterning the conductive material.

The first lower insulating layer 13 may include a plurality of insulating layers. The first lower insulating layer 13 may be partially formed in each operation of forming the circuit wiring pattern. A lower protective layer (not illustrated) at least partially covering an upper surface of the third wiring line 11c may be additionally formed on the first lower insulating layer 13. A second lower insulating layer 15 may be formed on the first lower insulating layer 13.

A second substrate 17a may be formed on the second lower insulating layer 15. To form a ground pattern 18, a via hole extending from an upper surface of the second lower insulating layer 15 into the peripheral source/drain region 9b of the first substrate 4 may be formed. The via hole may be filled with a material constituting the second substrate 17a, and the second substrate 17a may be formed thereon. Therefore, the ground pattern 18 may be formed. The ground pattern 18 may be formed of, for example, polycrystalline silicon, and may be formed by a CVD process.

Figure 13B:
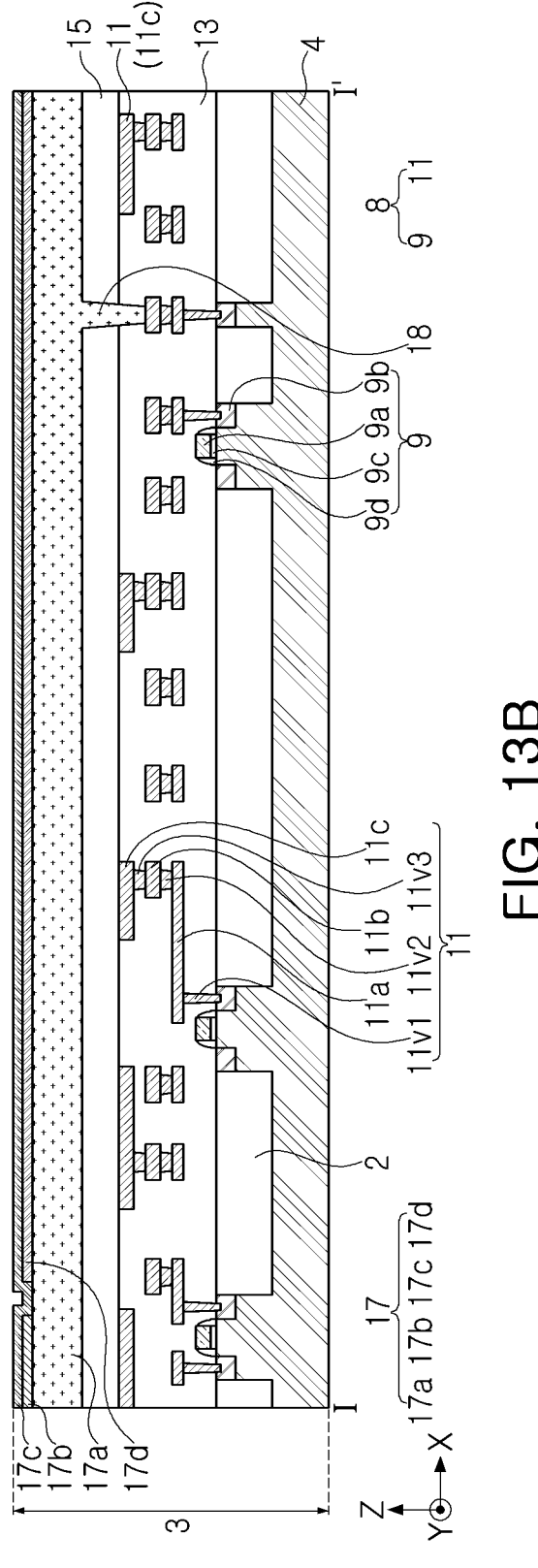

Referring to FIG. 13B, intermediate pattern layers 17b and 17d spaced apart from each other may be formed on the second substrate 17a, and a pattern layer 17c on the second substrate 17a and at least partially covering the intermediate pattern layers 17b and 17d may be formed. The second substrate 17a and the second pattern layer 17c may be formed as a silicon layer. The intermediate pattern layers 17b and 17d may include a plurality of sequentially stacked layers, for example, a silicon oxide layer, a silicon nitride layer, and a silicon oxide layer.

Figure 13C:
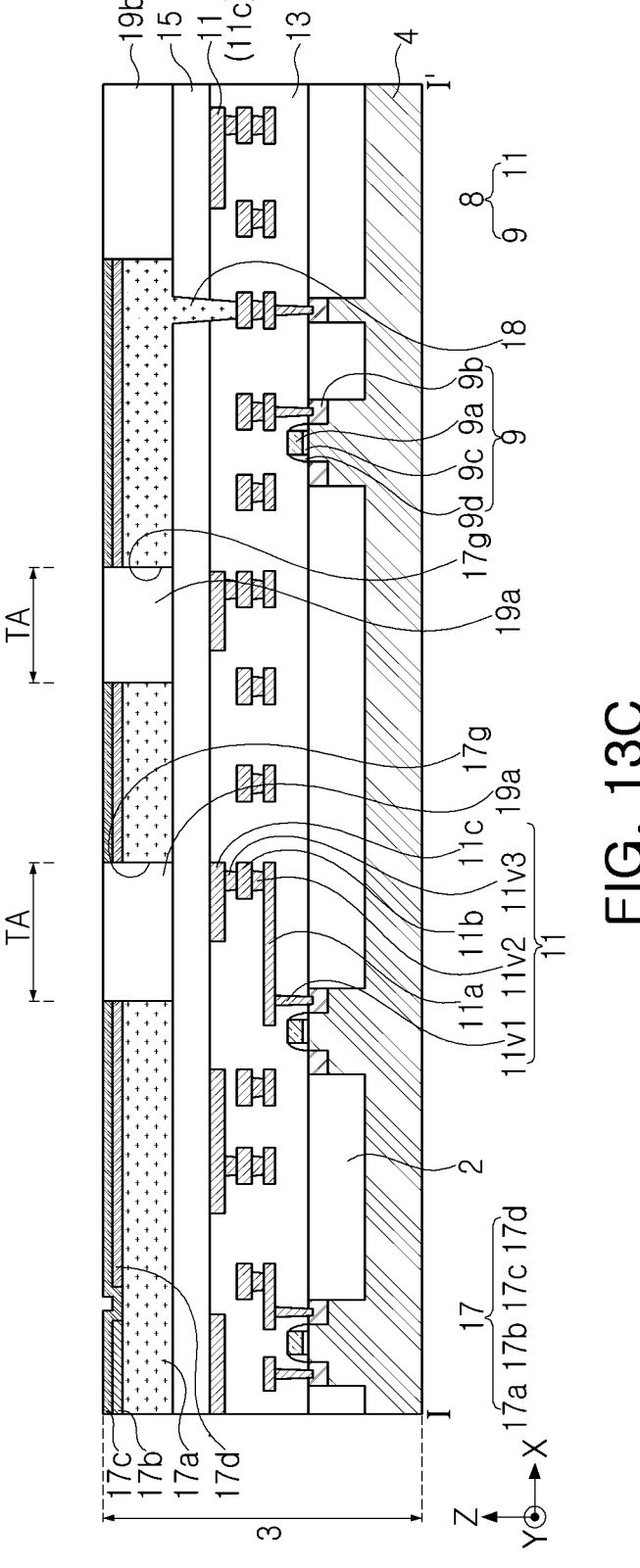

Referring to FIG. 13C, gaps 17g passing through the second substrate 17a and the intermediate pattern layers 17c and 17d may be formed. The gaps 17g may be slits or openings passing through the second substrate 17a and the intermediate pattern layers 17c and 17d. The gaps 17g may be filled with an insulating material to form an inner intermediate insulating layer 19a and an outer intermediate insulating layer 19b. The insulating material filling the gaps 17g may be, for example, silicon nitride or silicon oxide. Therefore, a first structure 3 may be formed.

Figure 13D:
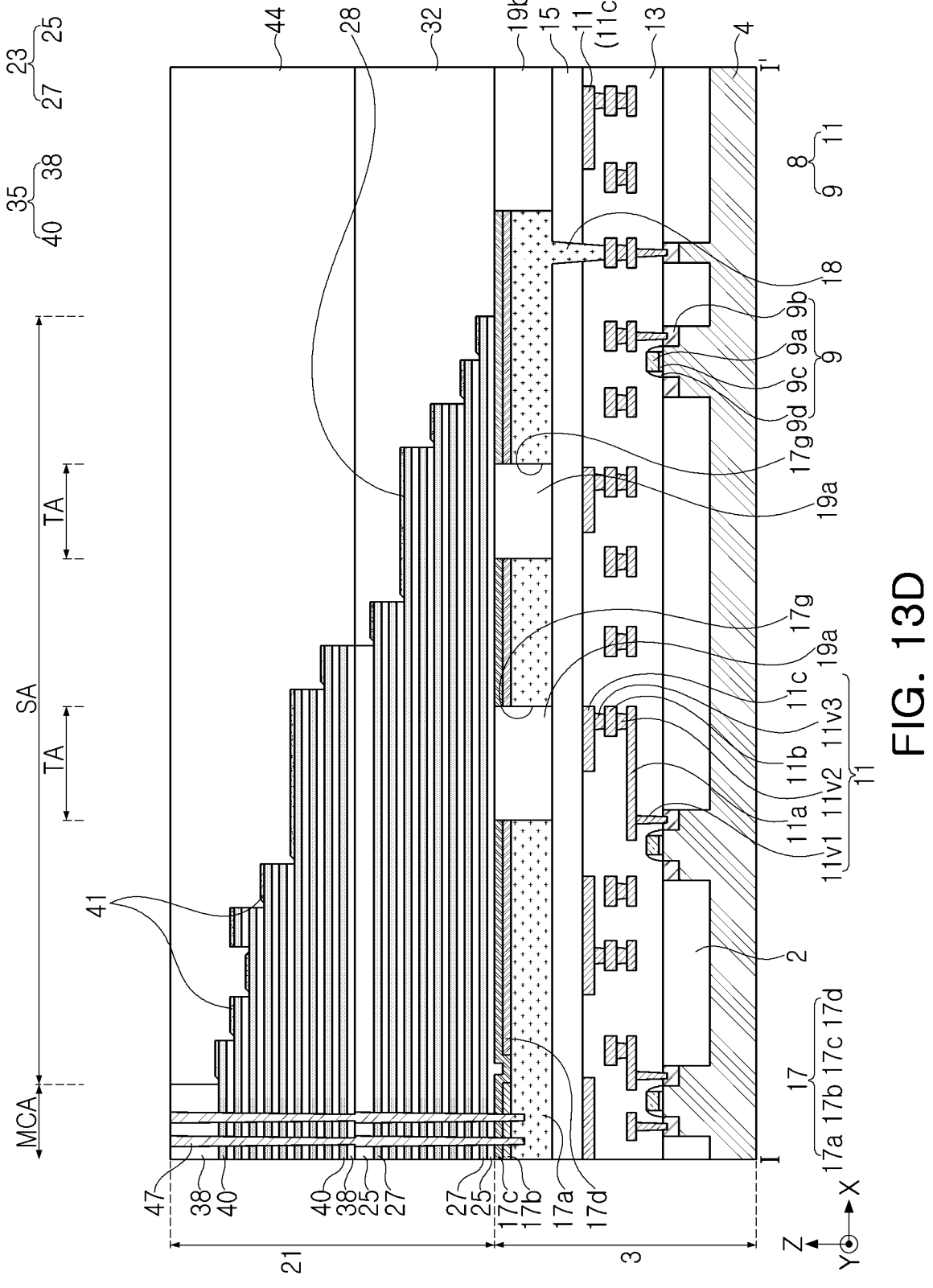

Referring to FIG. 13D, a second preliminary structure 21 may be formed on the first structure 3. The second preliminary structure 21 may include preliminary stack structures 23 and 35 including interlayer insulating layers 25 and 38 and horizontal layers 27 and 40, alternately stacked, and capping insulating layers 32 and 44 covering at least a portion of the preliminary stack structures 23 and 35. The horizontal layers 27 and 40 may include pad regions arranged to have a stepped shape. For example, the formation of the second preliminary structure 21 may include forming a first preliminary stack structure 23 on the first structure 3, forming a first capping insulating layer 32 covering a portion of the first preliminary stack structure 23 and the outer intermediate insulating layer 19b, forming a second preliminary stack structure 35 on the first preliminary stack structure 23, and forming a second capping insulating layer 44 covering a portion of the second preliminary stack structure 35 and the first capping insulating layer 32.

The first preliminary stack structure 23 may include first interlayer insulating layers 25 and first horizontal layers 27, alternately and repeatedly stacked. The second preliminary stack structure 35 may include second interlayer insulating layers 38 and second horizontal layers 40, alternately and repeatedly stacked. The first and second interlayer insulating layers 25 and 38 may be formed of silicon oxide, and the first and second horizontal layers 27 and 40 may be formed of silicon nitride.

In an illustrative example, on at least one side of the first preliminary stack structure 23, the first horizontal layers 27 may include pad regions arranged to have a step shape. On at least one side of the second preliminary stack structure 35, the second horizontal layers 40 may include pad regions arranged to have a step shape. In the second preliminary structure 21, a region in which the pad regions arranged to have a step shape of the first and second horizontal layers 27 and 40 are located may be defined as a stepped region SA, and a region in which the first and second horizontal layers 27 and 40 are located to be adjacent to the stepped region SA may be defined as a memory cell array region MCA.

In an illustrative example, before forming the first capping insulating layer 32, first reinforcing horizontal layers 28 may be formed on regions of the first horizontal layers 27 arranged in a stepped shape. Before forming the second capping insulating layer 44, second reinforcing horizontal layers 41 may be formed on pad regions of the second horizontal layers 40 arranged in a step shape. The first and second reinforcing horizontal layers 28 and 41 may be formed of silicon nitride.

A memory vertical structure 47 passing through the memory cell array region MCA of the second preliminary structure 21 and contacting the second substrate 17a may be formed. The formation of the memory vertical structure 47 may include forming a sacrificial vertical portion passing through the first preliminary stack structure 23 before forming the second preliminary stack structure 35, forming an upper channel hole passing through the second preliminary stack structure 35 and exposing the sacrificial vertical portion after forming the second preliminary stack structure 35, forming a lower channel hole by removing the sacrificial vertical portion exposed by the channel hole, and forming the memory vertical structure 47 in the lower and upper channel holes. The memory vertical structure 47 may include an information storage structure (49 in FIG. 5), a channel layer (51 in FIG. 5), an insulating gap-fill layer (53 in FIG. 5), and a pad material layer (in FIG. 5) as described with reference to FIG. 5 may be included.

Figure 13E:
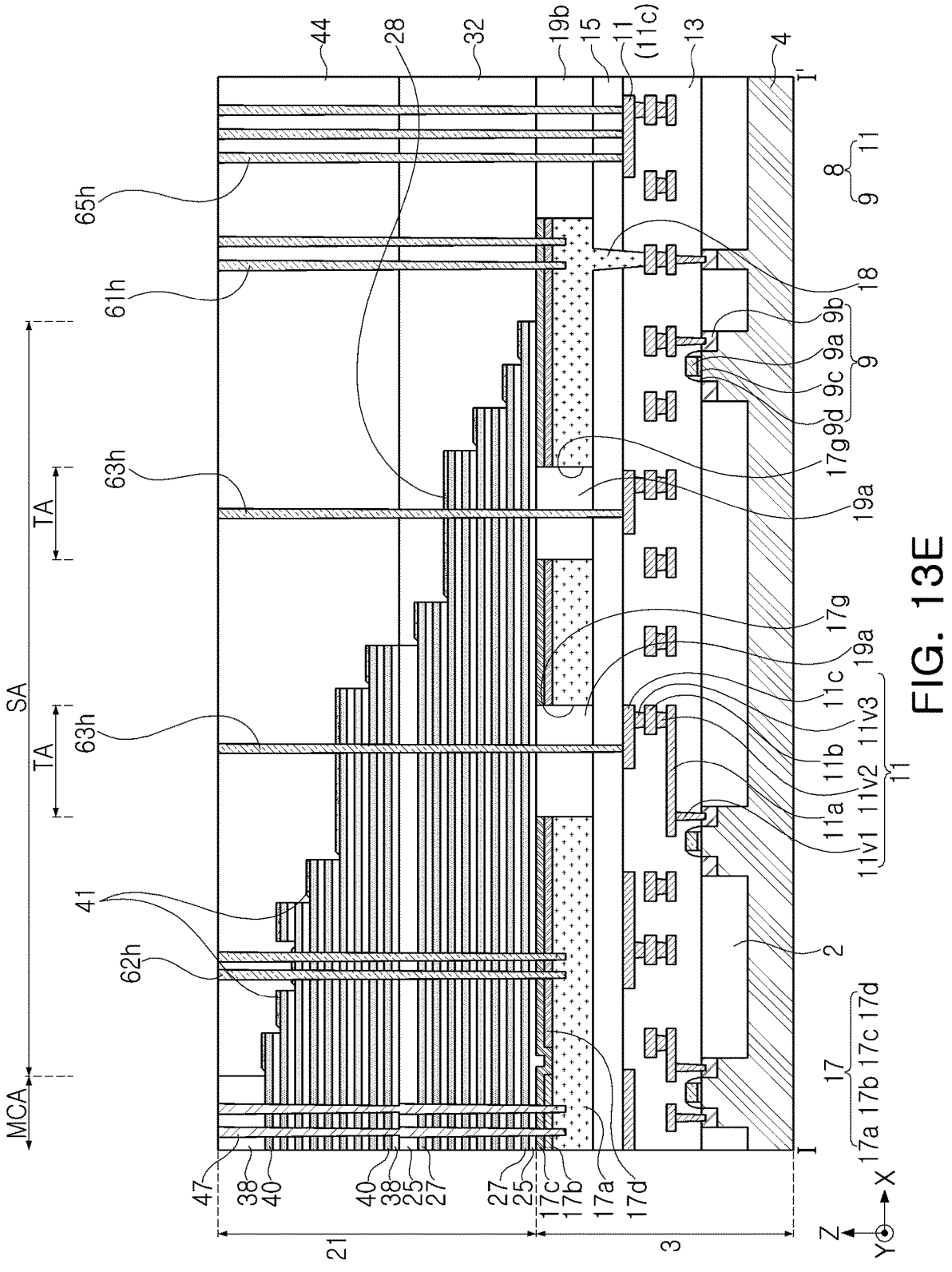

Referring to FIG. 13E, peripheral contact plug holes 61h, 63h, and 65h and dummy plug holes 62h may be simultaneously formed, and the holes may be respectively filled with a sacrificial material, for example, polysilicon. A first peripheral contact plug hole 61h may pass through the second preliminary structure 21, and may be in contact with the second substrate 17a. The first peripheral contact plug hole 61h may pass through the first and second capping insulating layers 32 and 44 of the second preliminary structure 21, and may be spaced apart from the preliminary stack structure 23 and 35 of the second preliminary structure 21. A second peripheral contact plug hole 63h may pass through the second preliminary structure 21 and the inner intermediate insulating layer 19a, and may extend in a downward direction to contact the third wiring line 11c. A third peripheral contact plug hole 65h may pass through the first and second capping insulating layers 32 and 44 of the second preliminary structure 21 and the outer intermediate insulating layer 19b, and may extend in a downward direction to contact the third wiring line 11c. The dummy plug holes 62h may pass through the preliminary stack structures 23 and 35 of the second preliminary structure 21, and may be in contact with the second substrate 17a.

Figure 13F:
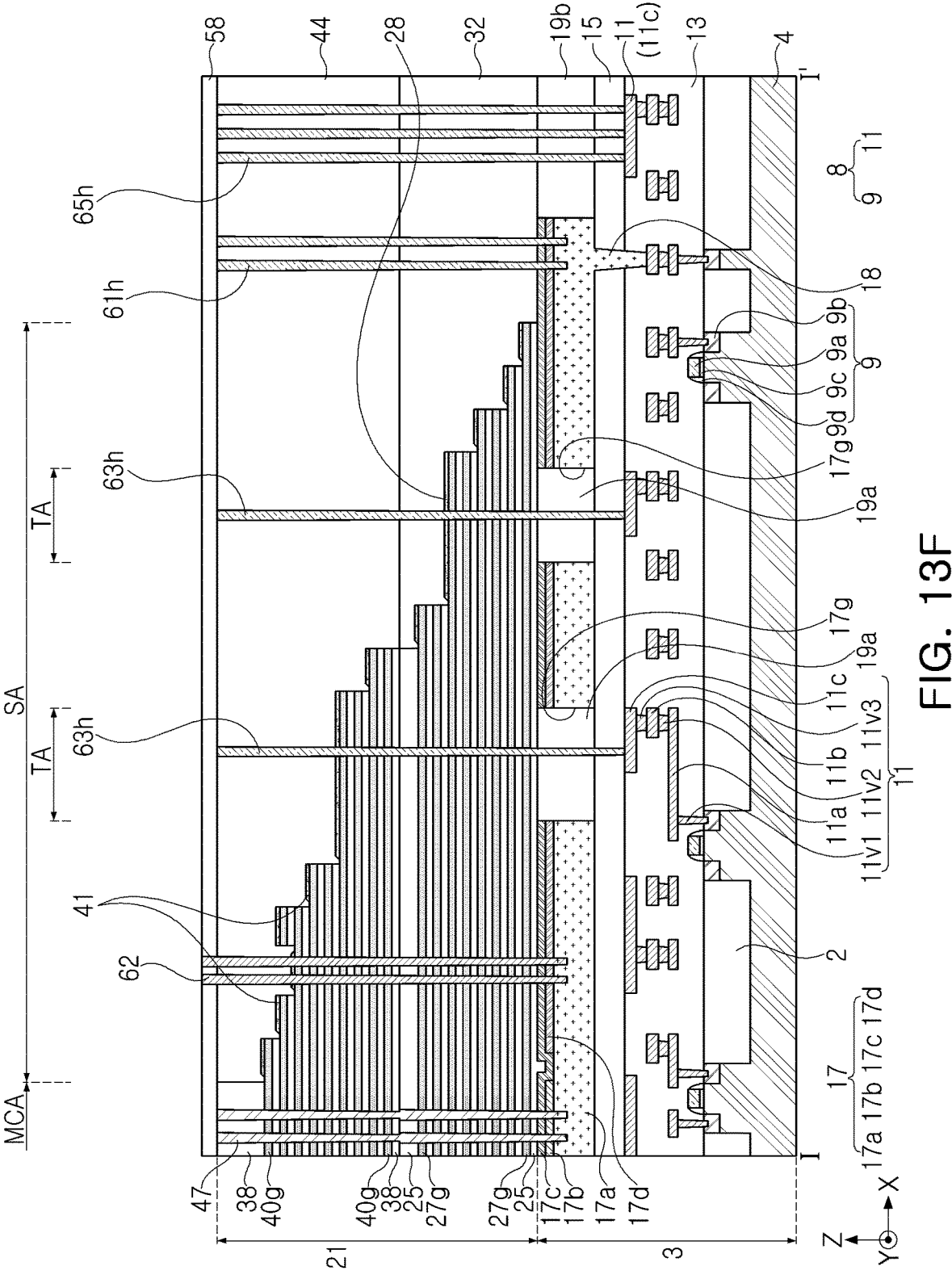

Referring to FIG. 13F, a first upper insulating layer 58 may be formed on the second preliminary structure 21. The first upper insulating layer 58 may have a substitution pattern having a shape corresponding to an upper surface of the dummy plug hole 62h. The substitution pattern of the first upper insulating layer 58 may be bonded to the dummy plug hole 62h, the sacrificial material of the dummy plug hole 62h may be removed through the substitution pattern, and the dummy plug hole 62h and the substitution pattern of the first upper insulating layer 58 may be filled with silicon oxide. Therefore, a support vertical structure 62 may be formed.

Figure 13G:
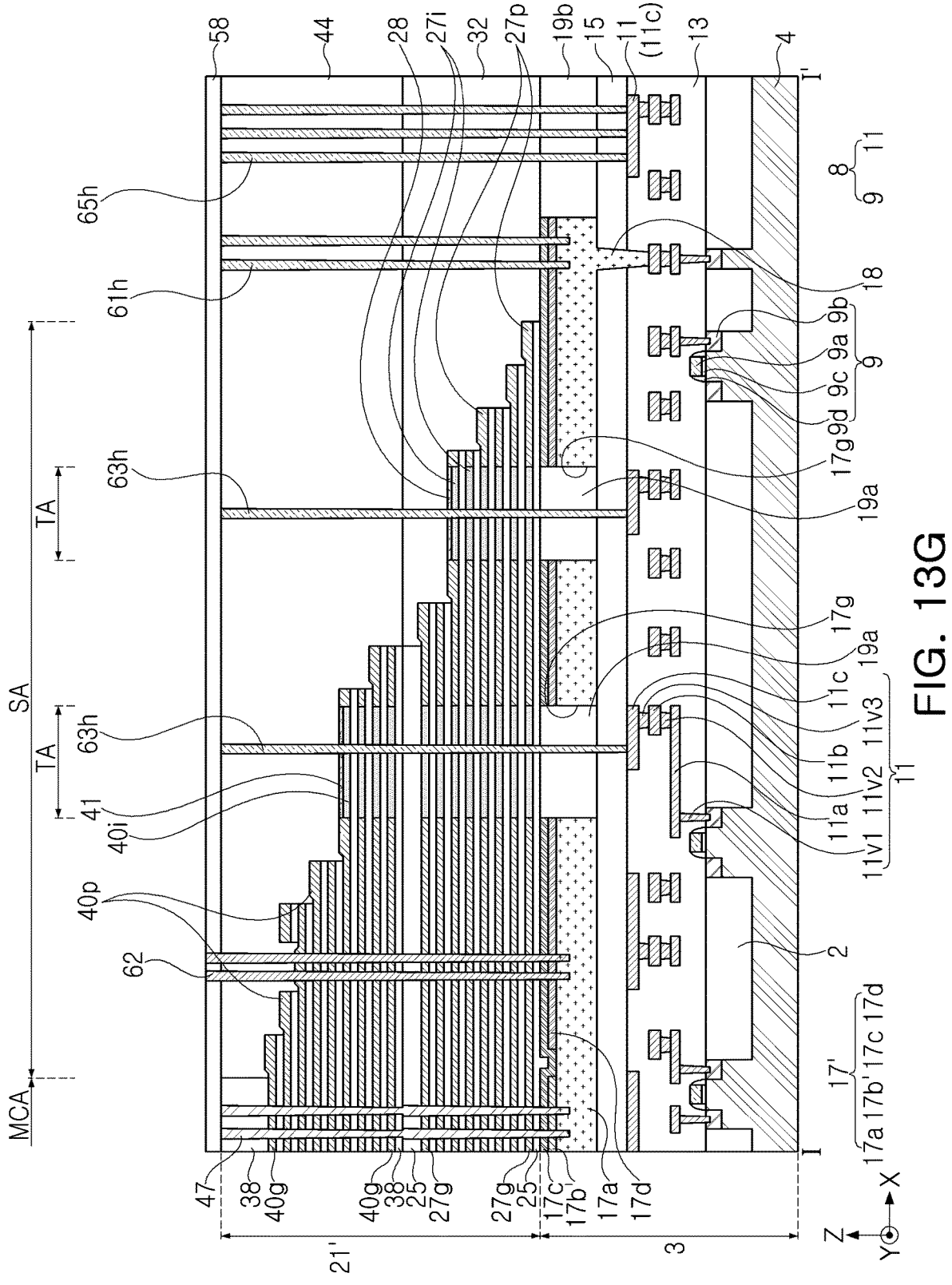

Referring to FIG. 13G, a portion of the first and second horizontal layers 27 and 40 of the second preliminary structure 21 may be replaced with first and second gate layers 27g and 40g, respectively. Isolation trenches sequentially passing through the first upper insulating layer 58 and the second preliminary structure 21 and extending into a preliminary pattern structure 17 may be formed. The isolation trenches may be regions corresponding to separation structures (68 of FIG. 1). The isolation trenches may expose a first intermediate pattern layer 17b in a lower portion of the memory cell array region MCA, and may be spaced apart from a second intermediate pattern layer 17d. After the first intermediate pattern layer 17b exposed by the isolation trenches is removed, a first pattern layer 17b' may be formed in a space from which the first intermediate pattern layer 17b is removed. The first pattern layer 17b' may be formed of a polysilicon layer having N-type conductivity. The remaining second intermediate pattern layer 17d may be referred to as a third pattern layer 17d.

The first and second horizontal layers 27 and 40 of the second preliminary structure 21 exposed by the isolation trenches may be partially etched to form empty spaces, and the first and second gate layers 27g and 40g may be formed in the empty spaces. The first preliminary stack structure 23 may be formed as a first stack structure 23' including the first interlayer insulating layers 25 and the first gate layers 27g, and the second preliminary stack structure 35 may be formed as a second stack structure 35' including the second interlayer insulating layers 38 and the second gate layers 40g. Therefore, the second preliminary structure 21 may be formed as a second structure 21' including the first and second stack structures 23' and 35'.

The first and second horizontal layers 27 and 40 may remain, and may be formed as first and second insulating horizontal layers 27i and 40i, respectively. Regions in which the first and second insulating horizontal layers 27i and 40i are formed in the second structure 21' may be defined as through-regions TA.

In an illustrative example, before forming the first and second gate layers 27g and 40g in the empty spaces, a dielectric layer may be formed. The formation of the first and second gate layers 27g and 40g in the empty spaces may include forming conductive material layers in the empty spaces and etching the conductive material layers.

Separation structures 68 may be formed in the isolation trenches. The separation structures 68 may be formed of silicon oxide.

Figure 13H:
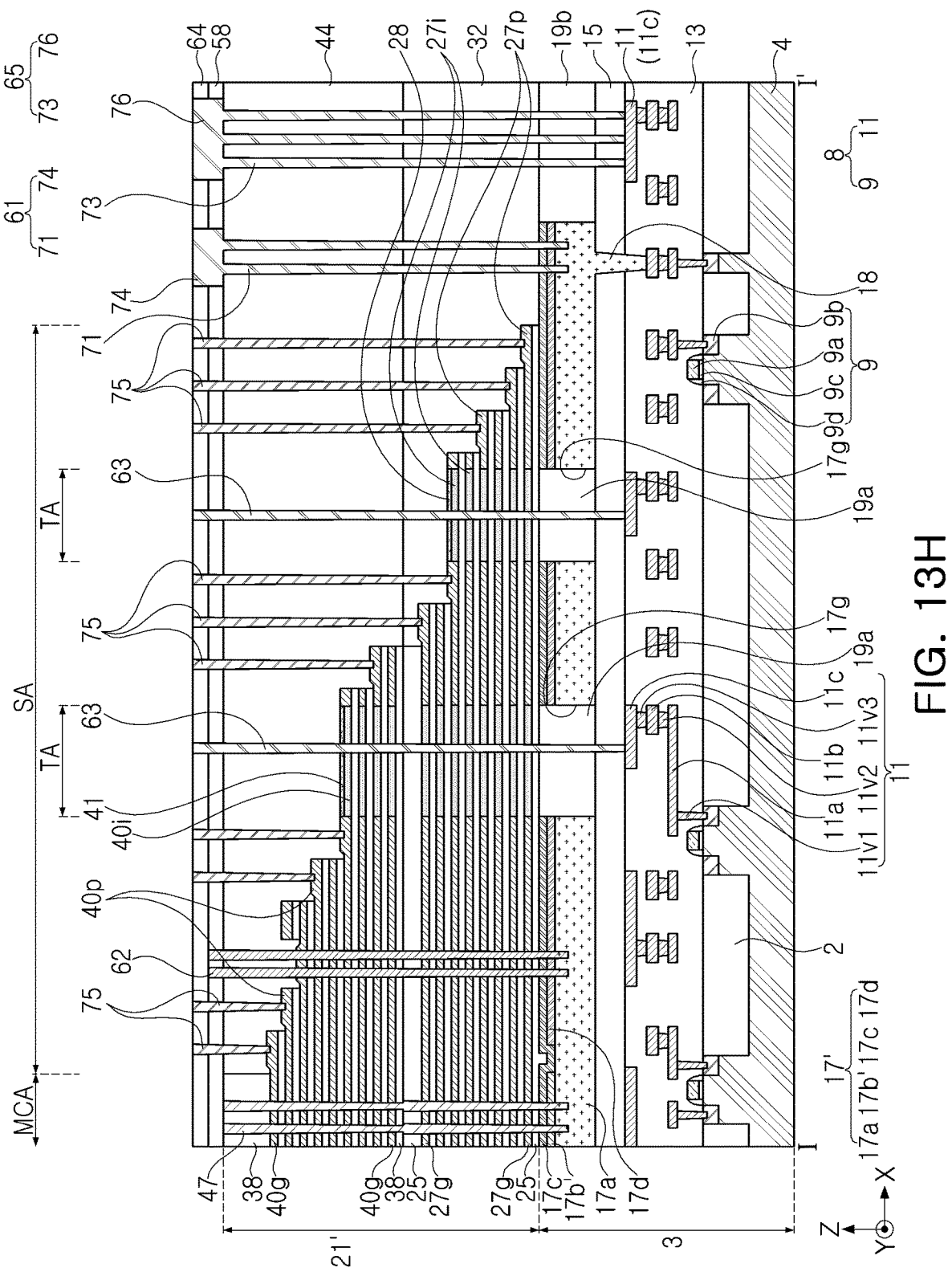

Referring to FIG. 13H, gate contact plugs 75 passing through the first upper insulating layers 58 and extending in a downward direction to contact the gate pads 40p may be formed. Thereafter, a second upper insulating layer 64 may be formed on the first upper insulating layer 58. The first and second upper insulating layers 58 and 64 may include a substitution pattern connecting at least a portion of the first peripheral contact plug holes 61h, a substitution pattern connecting at least a portion of the third peripheral contact plug holes 65h, and a substitution pattern having a shape corresponding to that of the second peripheral contact plug holes 63h. In an illustrative example, the substitution pattern connecting at least a portion of the first peripheral contact plug holes 61h may have a lattice shape as illustrated in FIG. 6A, and the substitution pattern connecting at least a portion of the third peripheral contact plug holes 65h may have a lattice shape as illustrated in FIG. 10. The substitution patterns of the first and second upper insulating layers 58 and 64 may be bonded to the first to third peripheral contact plug holes 61h, 63h, and 65h, and sacrificial materials of the first to third peripheral contact plug holes 61h, 63h, and 65h may be removed through the substitution patterns. Thereafter, the first to third peripheral contact plug holes 61h, 63h, and 65h and the corresponding substitution patterns may be filled with a conductive material, for example, tungsten (W). Therefore, first to third peripheral contact structures 61, 63, and 65 may be formed.

A plurality of first through-vias 71 and a first peripheral contact pattern 74 may be integrally formed, and a plurality of third through-vias 73 and a third peripheral contact pattern 76 may be integrally formed. For example, the plurality of first through-vias 71 and the first peripheral contact pattern 74 may be formed by a single deposition process, and the plurality of third through-vias 73 and the third peripheral contact pattern 76 may be formed by a single deposition process. Therefore, no interfaces may exist between the plurality of first through-vias 71 and the first peripheral contact pattern 74 and between the plurality of third through-vias 73 and the third peripheral contact pattern 76.

In the embodiment illustrated in FIG. 13H, the second peripheral contact structure 63 may include a through-via, and may have a substitution pattern having a shape corresponding to the through-via, but a shape of the second peripheral contact structure 63 is not limited thereto. In an illustrative example, the second peripheral contact structure may include a plurality of second through-vias, and may have a second peripheral contact pattern connecting at least a portion of the second through-vias to each other. The second peripheral contact pattern may have a shape corresponding to, for example, the third wiring lines 11c to which the second through-vias are connected. For example, the second peripheral contact pattern may have a grid shape, a linear shape, or a plate shape.

Figure 13I:
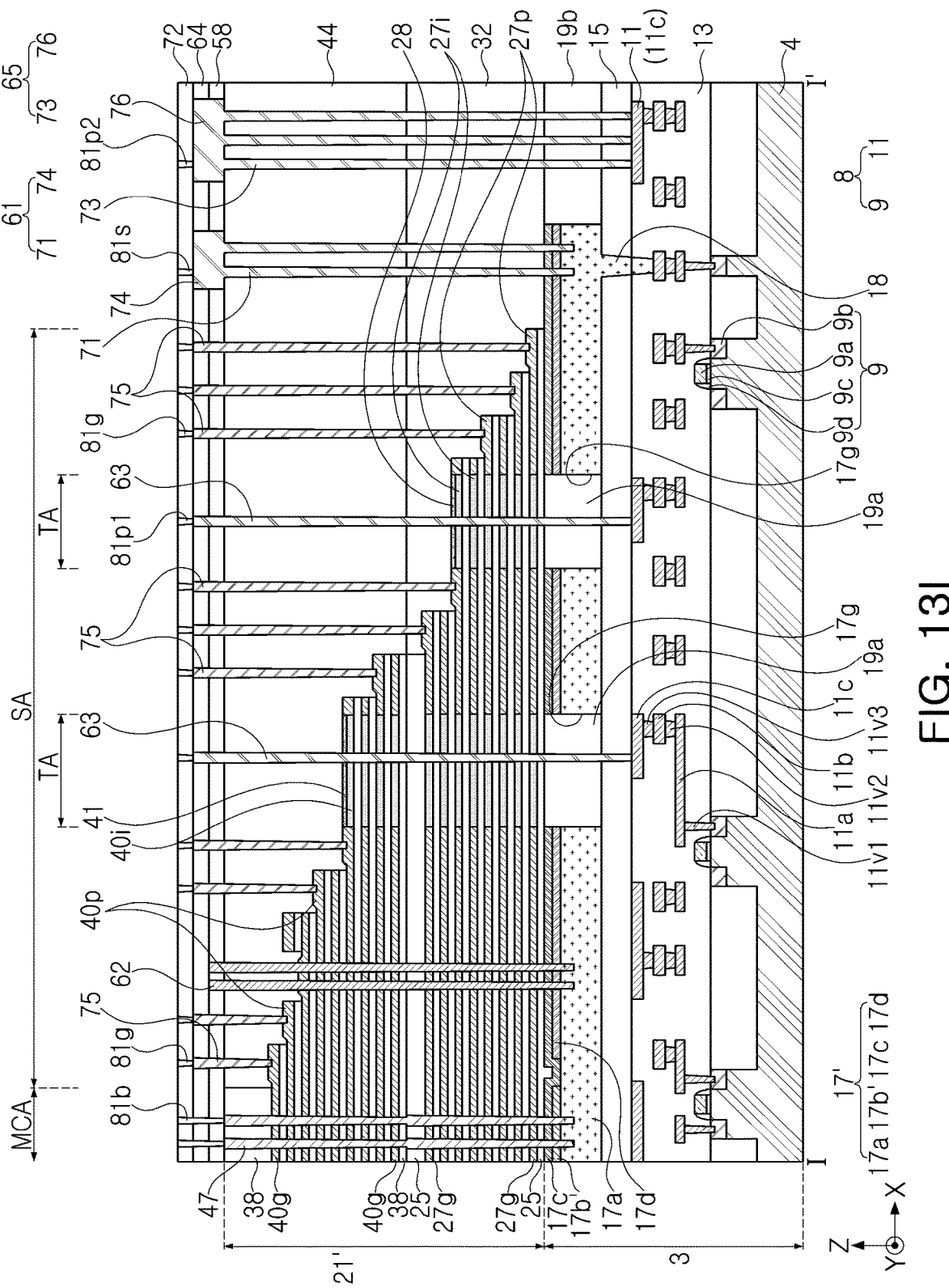

Referring to FIG. 13I, a third upper insulating layer 72 may be formed on the second upper insulating layer 64. A bit line contact plug 81b passing through the first to third upper insulating layers 58, 64, and 72 and electrically connected to the memory vertical structure 47, periphery upper plugs 81s, 81p1 and 81p2 passing through the third upper insulating layers 72, and gate upper plugs 81g passing through the third upper insulating layer 72 and electrically connected to the gate contact plugs 75 may be formed.

Again, referring to FIGS. 2A to 2C, wirings 84b, 84g, 84s, and 84p may be formed on the third upper insulating layer 72. The wirings 84b, 84g, 84s, and 84p may include bit lines 84b electrically connected to the bit line contact plugs 81b, gate connection wires 84g electrically connecting each of the gate upper plugs 81g and each of the plurality of second peripheral upper plugs 81p1, a first peripheral wiring 84s electrically connected to the first peripheral upper plug 81s, and a second peripheral wiring 84p electrically connected to the third peripheral upper plug 81p2.

Next, a data storage system including a semiconductor device according to an example embodiment of the present disclosure will be described with reference to FIGS. 14, 15 and 16, respectively.

Figure 14:
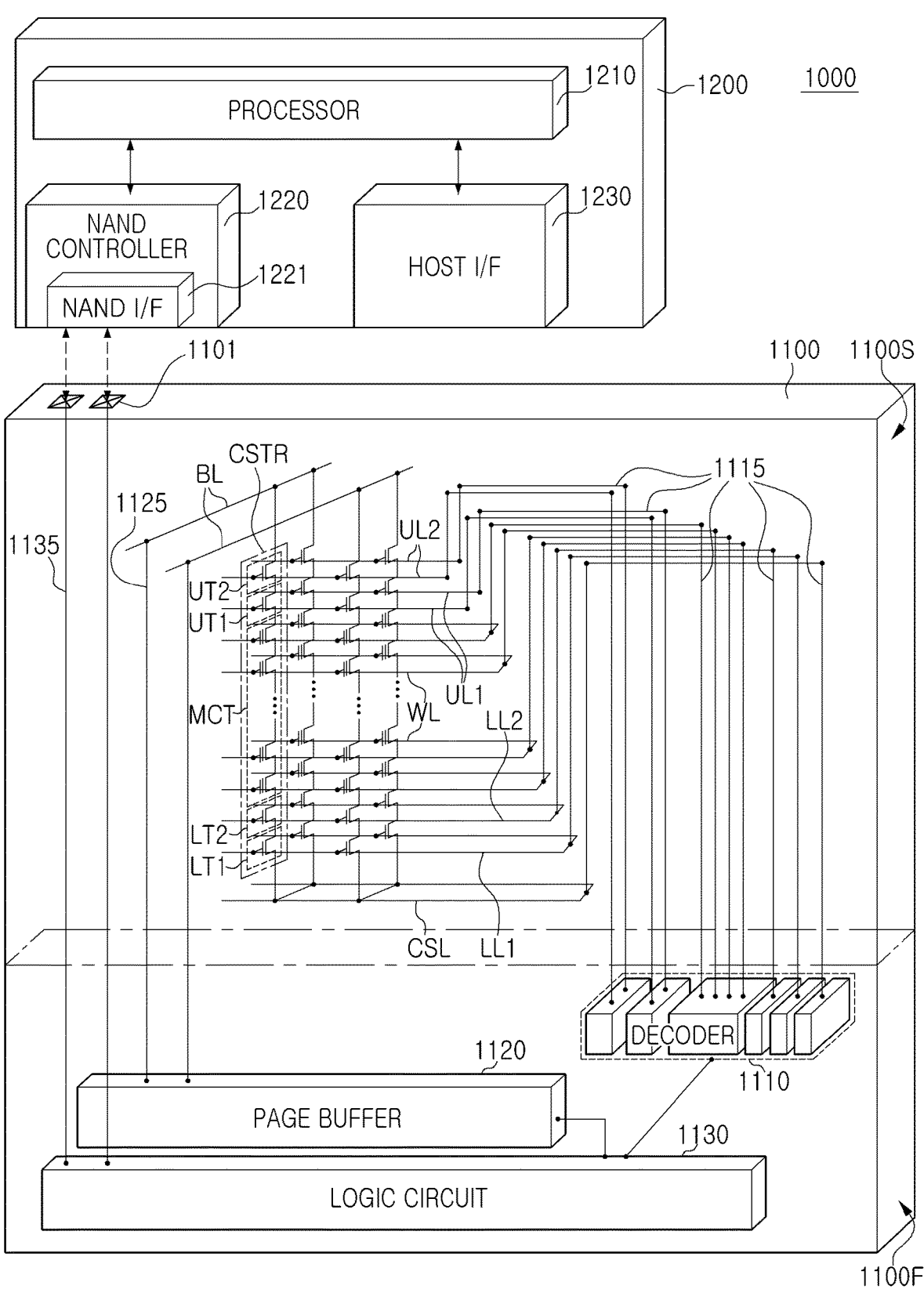
FIG. 14 is a view schematically illustrating a data storage system including a semiconductor device according to example embodiments.

FIG. 14 is a view schematically illustrating a data storage system including a semiconductor device according to example embodiments.

Referring to FIG. 14, a data storage system 1000 may include a semiconductor device 1100, and a controller 1200 electrically connected to the semiconductor device 1100 and controlling the semiconductor device 1100. The data storage system 1000 may be a storage device including the semiconductor device 1100, or an electronic device including the storage device. For example, the data storage system 1000 may be a solid state drive device (SSD), a universal serial bus (USB), a computing system, a medical device, or a communication device, including the semiconductor device 1100.

In one embodiment, the data storage system 1000 may be an electronic system storing data.

The semiconductor device 1100 may be a semiconductor device according to any one of the embodiments described above with reference to FIGS. 1 to 12. The semiconductor device 1100 may include a first structure 1100F, and a second structure 1100S on the first structure 1100F.

The first structure 1100F may be a peripheral circuit structure including a decoder circuit 1110, a page buffer 1120, and a logic circuit 1130. For example, the first structure 1100F may include the peripheral circuit (8 in FIG. 2A) described above.

The second structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

The second substrate 17a, described above, may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT between each of the lower transistors LT1 and LT2 and each of the upper transistors UT1 and UT2. The number of lower transistors LT1 and LT2 and the number of upper transistors UT1 and UT2 may be variously changed according to embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

Among the first and second gate layers 27g and 40g described above with reference to FIG. 5, the lower gate layers GL1 and GL2 may be the gate lower lines LL1 and LL2, and at least a plurality of intermediate gate layers, among the intermediate gate layers GM, may be the word lines WL, and the upper gate layers GU1 and GU2 may be the gate upper lines UL1 and UL2.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT1 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F into the second structure 1100S.

In example embodiments, the above-described lower gate layers (GL1 and GL2 in FIG. 5) may be the gate lower lines LL1 and LL2, and the upper gate layers (GU1 and GU2 in FIG. 5) may be the gate upper lines UL1 and UL2. A plurality of the intermediate gate layers (GM in FIG. 5) may be the word lines WL.

The bit lines BL may be electrically connected to the page buffer 1120 through second connection lines 1125 extending from the first structure 1100F to the second structure 1100S. The bit lines BL may be the bit lines 84b of FIGS. 2A and 2B described above.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. According to some embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 15:
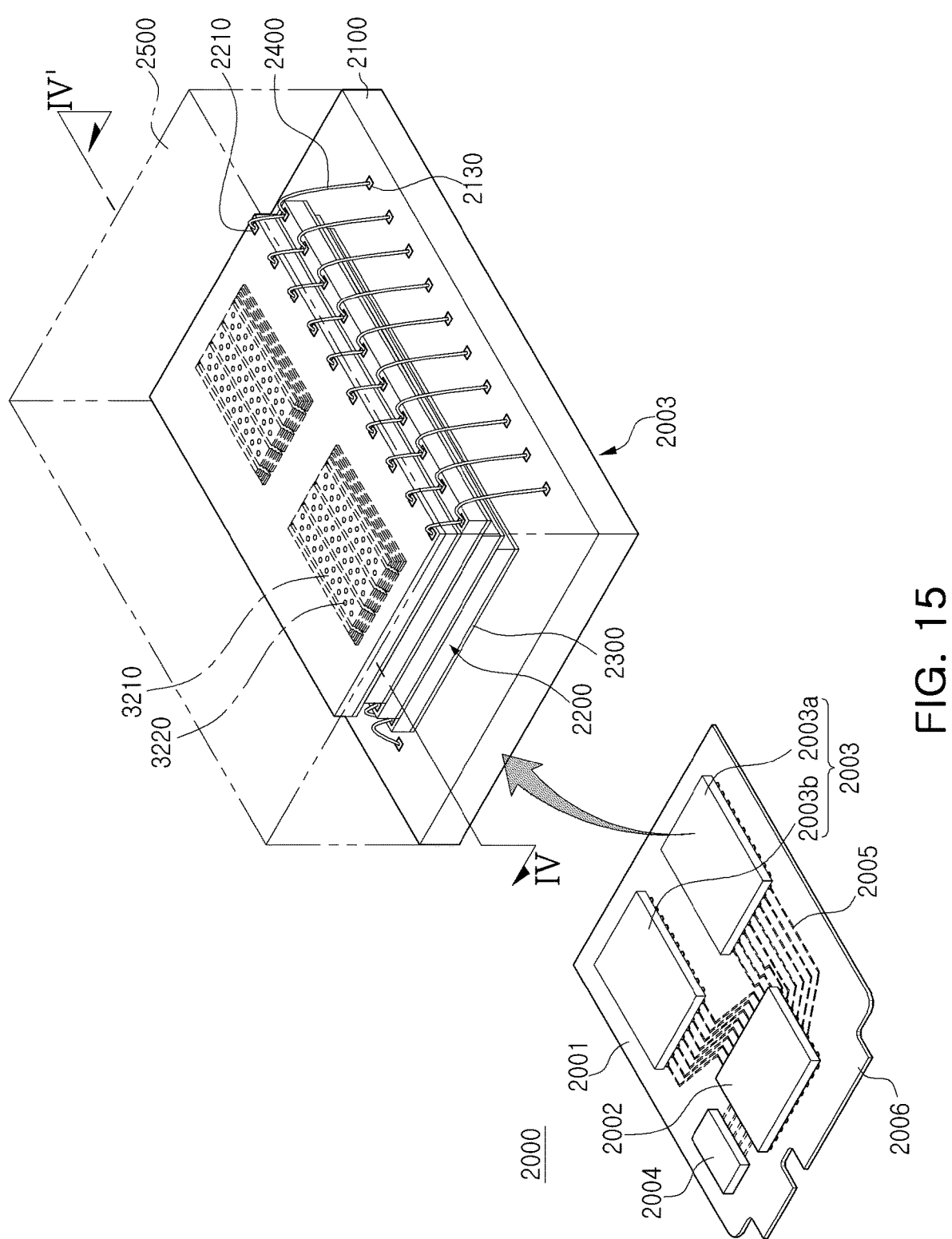
FIG. 15 is a perspective view schematically illustrating a data storage system including a semiconductor device according to an example embodiment.

FIG. 15 is a perspective view schematically illustrating a data storage system including a semiconductor device according to an example embodiment.

Referring to FIG. 15, a data storage system 2000 according to an example embodiment of the present disclosure may include a main substrate 2001, a controller 2002 on the main substrate 2001, at least one semiconductor package 2003, and a DRAM 2004. In one embodiment, the controller 2002 may be mounted upon the main substrate 2001. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component wiring express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the semiconductor chips 2200 may include the semiconductor device according to any one of the embodiments described above with reference to FIGS. 1 to 12.

Each of the first and second semiconductor packages 2003a and 2003b may include a package substrate 2100, semiconductor chips 2200 on the package substrate 2100, adhesive layers 2300 on a lower surface of each of the semiconductor chips 2200, a connection structure 2400 electrically connecting each of the semiconductor chips 2200 and the package substrate 2100, and a molding layer 2500 at least partially covering the semiconductor chips 2200 and the connection structure 2400 on the package substrate 2100.

The package substrate 2100 may be a printed circuit board including package upper pads 2130. Each of the semiconductor chips 2200 may include an input/output pad 2210.

In example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In a example embodiment, the controller 2002 and the semiconductor chips 2200 may be on a separate interposer substrate, different from the main substrate 2001, and the controller 2002 and the semiconductor chips 2200 may be connected to each other by a wiring formed on the interposer substrate. In one embodiment, the controller 2002 and the semiconductor chips 2200 may be mounted upon a separate interposer substrate. Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral wirings 3110. The second structure 3200 may include a gate stack structure 3210 and channel structures 3220, as will be discussed more fully below with respect to FIG. 16.

Figure 16:
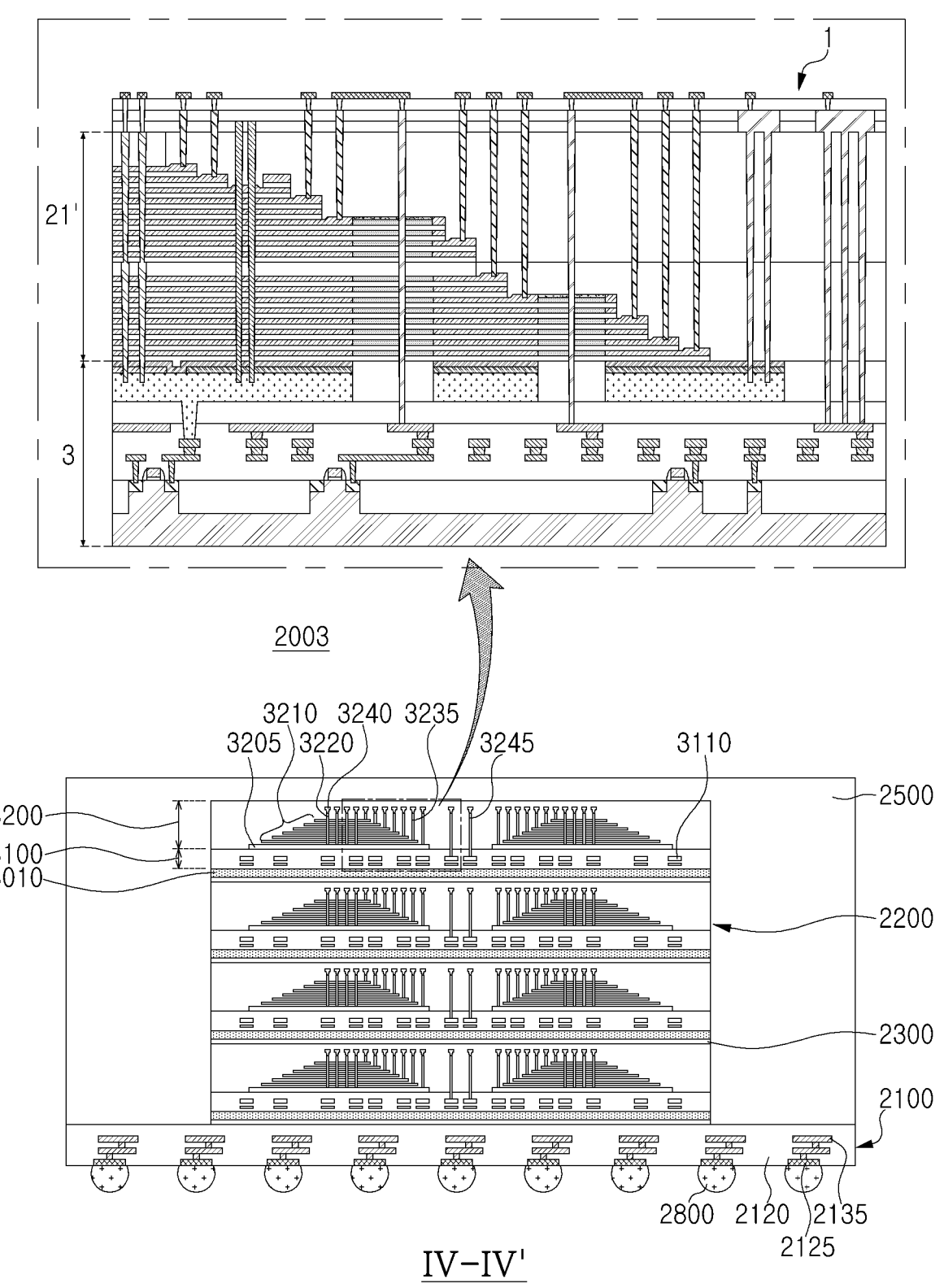
FIG. 16 is a cross-sectional view schematically illustrating a semiconductor package according to an example embodiment.

FIG. 16 is a cross-sectional view schematically illustrating a semiconductor package according to an example embodiment. FIG. 16 illustrates an example embodiment of the semiconductor package 2003 of FIG. 15, and conceptually illustrates a region taken along line IV-IV' of the semiconductor package 2003 of FIG. 15.

Referring to FIG. 16 in conjunction with FIG. 15, in the semiconductor package 2003, the package substrate 2100 may be a printed circuit board. The package substrate 2100 may include a package substrate body portion 2120, package upper pads 2130 on an upper surface of the package substrate body portion 2120, lower pads 2125 on a lower surface of the package substrate body portion 2120 or exposed from the lower surface, and internal wirings 2135 electrically connecting the upper pads 2130 and the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000, as illustrated in FIG. 11, through conductive connection portions 2800.

Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 and separation regions 3230, passing through the gate stack structure 3210, bit lines 3240 electrically connected to the memory channel structures 3220, and gate connection wirings 3235 electrically connected to word lines WL of the gate stack structure 3210. The first structure 3100 may include the first structure 1100F of FIG. 14, and the second structure 3200 may include the second structure 1100S of FIG. 14.

Each of the semiconductor chips 2200 may include a through-wiring 3245 electrically connected to the peripheral wirings 3110 of the first structure 3100 and extending into the second structure 3200. The through-wiring 3245 may pass through the gate stack structure 3210 and may be further disposed outside the gate stack structure 3210.

Each of the semiconductor chips 2200 may further include the input/output pad (2210 in FIG. 15) electrically connected to the peripheral wirings 3110 of the first structure 3100.

In FIG. 16, an enlarged portion indicated by reference numeral '1' is for explaining that the semiconductor chips 2200 of FIG. 16 may be modified to include the cross-sectional structure as in FIG. 2A. Therefore, each of the semiconductor chips 2200 may include the semiconductor device 1 according to any one of the embodiments described above with reference to FIGS. 1 to 12.

According to embodiments of the present disclosure, a semiconductor device and a data storage system, improving a degree of integration and reliability, may be provided by including a peripheral contact pattern connecting a plurality of through-vias.

Various advantages and effects of the present disclosure are not limited to the above, and will be more easily understood in the process of describing specific embodiments of the present disclosure.

While example embodiments have been illustrated and described above, it will be apparent to those skilled in the art that modifications and variations could be made without departing from the scope of the present disclosure as defined by the appended claims.

What is claimed is:

1. A semiconductor device comprising:
   a first substrate;
   a second substrate comprising a first region and a second region;
   a stack structure in the first region and extending from the first region into the second region, wherein the stack structure comprises one or more interlayer insulating layers and one or more gate layers alternately stacked on the second substrate in a first direction perpendicular to an upper surface of the second substrate, wherein the one or more gate layers comprises a plurality of gate pads arranged to have a step shape in the second region;
   a capping insulating layer that at least partially covers the stack structure;
   an upper insulating layer on the stack structure and the capping insulating layer;
   a peripheral contact structure comprising: a plurality of through-vias contacting a portion of the second substrate, spaced apart from the one or more gate layers, and extending in the first direction; and a peripheral contact pattern on the plurality of through-vias and connecting at least a portion of the plurality of through-vias to each other;
   a memory vertical structure contacting the second substrate and passing through the stack structure in the first region;
   a support vertical structure contacting the second substrate and passing through the stack structure in the second region;
   a gate contact plug on one or more of the plurality of gate pads and configured to be electrically connected to one or more of the plurality of gate pads;
   a peripheral upper plug on the peripheral contact pattern and contacting the peripheral contact pattern; and
   a peripheral wiring on the peripheral upper plug and electrically connected to the peripheral upper plug,
   wherein the peripheral contact pattern comprises first lines extending in a second direction parallel to the upper surface of the second substrate, and second lines intersecting the first lines and extending in a third direction parallel to the upper surface of the second substrate, and
   wherein the first lines and the second lines are spaced apart from the upper surface of the second substrate by a same distance in the first direction.

2. The semiconductor device of claim 1, wherein an upper surface of the peripheral contact pattern is substantially coplanar with an upper surface of the gate contact plug.

3. The semiconductor device of claim 2, further comprising:
   a bit line contact plug on the memory vertical structure and contacting the memory vertical structure;
   a gate upper plug on the upper surface of the gate contact plug and contacting the gate contact plug;

a bit line on the bit line contact plug and electrically connected to the bit line contact plug; and a gate connection wiring on the gate upper plug and electrically connected to the gate upper plug, wherein the bit line, the gate connection wiring, and the peripheral wiring are on an upper surface of the upper insulating layer.

4. The semiconductor device of claim 1, wherein upper surfaces of the through-vias are in direct contact with a lower surface of the peripheral contact pattern and are substantially coplanar with an upper surface of the memory vertical structure, and wherein the lower surface of the peripheral contact pattern is directly on the capping insulating layer.

5. The semiconductor device of claim 1, wherein an upper surface of the support vertical structure is on a higher level in the first direction, relative to the upper surface of the second substrate, than an upper surface of the memory vertical structure, and wherein the support vertical structure comprises an insulating material.

6. The semiconductor device of claim 1, wherein each of the plurality of through-vias has a first width, and each of the first and second lines has a second width that is equal to or greater than the first width in a direction perpendicular to an extension direction of the first and second lines.

7. The semiconductor device of claim 1, wherein the peripheral contact pattern comprises:

at least one intersection portion in which one or more of the first lines and one or more of the second lines intersect;

a connection portion connecting neighboring intersection portions; and a protrusion portion extending from the intersection portion in a direction opposite to the connection portion.

8. The semiconductor device of claim 7, wherein at least a portion of an upper surface of each of the plurality of through-vias is in the intersection portion.

9. The semiconductor device of claim 1, wherein a length of each of the first lines in the second direction is greater than a maximum distance between any two of the plurality of through-vias in the second direction.

10. The semiconductor device of claim 9, wherein the first lines comprise side surfaces that are not vertically aligned with side surfaces of the plurality of through-vias.

11. The semiconductor device of claim 1, wherein the plurality of through-vias and the peripheral contact pattern are integrally formed.

12. The semiconductor device of claim 1, wherein upper surfaces of the first lines are substantially coplanar with upper surfaces of the second lines, and wherein the first lines are electrically connected to the second lines.

13. A semiconductor device comprising:

a first substrate;

circuit elements on the first substrate;

a circuit wiring pattern electrically connected to at least one of the circuit elements;

a second substrate above the circuit wiring pattern;

a stack structure comprising one or more interlayer insulating layers and one or more gate layers alternately stacked on the second substrate in a first direction perpendicular to an upper surface of the second substrate; and a first peripheral contact structure spaced apart from the stack structure, wherein the first peripheral contact structure comprises: a plurality of first through-vias extending in the first direction, and a first peripheral contact pattern on the plurality of first through-vias and connecting at least a portion of the plurality of first through-vias, wherein the circuit wiring pattern is below the plurality of first through-vias and connects the plurality of first through-vias, wherein the first peripheral contact pattern has a shape corresponding to a shape of at least a portion of the circuit wiring pattern, wherein the first peripheral contact pattern comprises;

first lines adjacent to each other in a second direction parallel to the upper surface of the second substrate, the first lines extending in a third direction parallel to the upper surface of the second substrate and intersecting the second direction; and second lines adjacent to each other in the third direction, the second lines extending in the second direction and electrically connected to the first lines, wherein upper surfaces of the first lines are substantially coplanar with upper surfaces of the second lines.

14. The semiconductor device of claim 13, wherein the plurality of first through-vias are in contact with the circuit wiring pattern from an outside of the second substrate.

15. The semiconductor device of claim 13, wherein the semiconductor device further comprises a second peripheral contact structure, the stack structure further comprises a through-region, the through-region comprises insulating horizontal layers located on the same level in the first direction, relative to the upper surface of the second substrate, as gate layers adjacent to the through-region, the second substrate comprises a gap, and the second peripheral contact structure is in contact with the circuit wiring pattern, and extends in the first direction to pass through the gap and the insulating horizontal layers of the through-region.

16. The semiconductor device of claim 13, wherein the semiconductor device further comprises a third peripheral contact structure, wherein the third peripheral contact structure comprises a plurality of third through-vias extending in the first direction, and a third peripheral contact pattern on the plurality of third through-vias and connecting at least a portion of the plurality of third through-vias, the second substrate is below the plurality of third through-vias and connects the plurality of third through-vias.

17. The semiconductor device of claim 13, wherein each of the first peripheral contact pattern and the portion of the circuit wiring pattern has a lattice shape in a plan view.

18. The semiconductor device of claim 13, wherein at least one of the first through-vias is overlapped in the first direction by a portion of the first peripheral contact pattern where one or more of the first lines intersects one or more of the second lines.

19. A data storage system comprising:

a main substrate;

a semiconductor device on the main substrate; and a controller electrically connected to the semiconductor device and configured to control the semiconductor device, wherein the semiconductor device comprises:

a first substrate;

circuit elements on the first substrate;

a circuit wiring pattern electrically connected to at least one of the circuit elements;

a second substrate above the circuit wiring pattern;

a stack structure comprising one or more interlayer insulating layers and one or more gate layers alternately stacked on the second substrate in a first direction perpendicular to an upper surface of the second substrate; and a peripheral contact structure spaced apart from the one or more gate layers, wherein the peripheral contact structure comprises a plurality of through-vias extending in the first direction, and a peripheral contact pattern on the plurality of through-vias and connecting at least a portion of the plurality of through-vias, wherein the circuit wiring pattern is below the plurality of through-vias and connects the plurality of through-vias, wherein the peripheral contact pattern has a shape corresponding to a shape of at least a portion of the circuit wiring pattern, wherein the peripheral contact pattern comprises:

first lines adjacent to each other in a second direction parallel to the upper surface of the second substrate, the first lines extending in a third direction parallel to the upper surface of the second substrate and intersecting the second direction; and second lines adjacent to each other in the third direction, the second lines extending in the second direction and electrically connected to the first lines, wherein upper surfaces of the first lines are substantially coplanar with upper surfaces of the second lines.

20. The data storage system of claim 19, wherein at least one of the through-vias is overlapped in the first direction by a portion of the peripheral contact pattern where one or more of the first lines intersects one or more of the second lines.

* * * * *